(12) United States Patent
Takahashi et al.

(10) Patent No.: US 6,856,566 B2
(45) Date of Patent: Feb. 15, 2005

(54) TIMER CIRCUIT AND SEMICONDUCTOR MEMORY INCORPORATING THE TIMER CIRCUIT

(75) Inventors: Hiroyuki Takahashi, Tokyo (JP); Masatoshi Sonoda, Tokyo (JP); Atsushi Nakagawa, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 70 days.

(21) Appl. No.: 10/343,806

(22) PCT Filed: Aug. 3, 2001

(86) PCT No.: PCT/JP01/06706
§ 371 (c)(1),
(2), (4) Date: Feb. 4, 2003

(87) PCT Pub. No.: WO02/13384
PCT Pub. Date: Feb. 14, 2002

(65) Prior Publication Data
US 2003/0189859 A1 Oct. 9, 2003

(30) Foreign Application Priority Data
Aug. 4, 2000 (JP) .................................... 2000-237520

(51) Int. Cl.[7] ................................................ G11C 7/00
(52) U.S. Cl. .................... 365/222; 365/211; 365/233
(58) Field of Search ................. 365/222, 233, 365/194, 225.7, 211, 212

(56) References Cited

U.S. PATENT DOCUMENTS

| | | | | |
|---|---|---|---|---|
| 4,716,551 A | * | 12/1987 | Inagaki | 365/222 |
| 4,943,960 A | * | 7/1990 | Komatsu et al. | 365/222 |
| 5,268,833 A | * | 12/1993 | Axer | 363/127 |
| 5,477,491 A | * | 12/1995 | Shirai | 365/194 |
| 5,495,452 A | * | 2/1996 | Cha | 365/222 |
| 5,652,729 A | * | 7/1997 | Iwata et al. | 365/222 |
| 5,801,982 A | * | 9/1998 | Blodgett | 365/149 |
| 5,963,103 A | * | 10/1999 | Blodgett | 331/75 |
| 6,735,726 B2 | * | 5/2004 | Muranaka et al. | 714/708 |

FOREIGN PATENT DOCUMENTS

| | | |
|---|---|---|
| JP | 5-307883 | 11/1993 |
| JP | 6-60648 | 3/1994 |
| JP | 6-295584 | 10/1994 |
| JP | 7-141865 | 6/1995 |
| JP | 7-221604 | 8/1995 |

* cited by examiner

Primary Examiner—Gene N. Auduong
(74) Attorney, Agent, or Firm—Choate, Hall & Stewart

(57) ABSTRACT

It is an object to provide a timer circuit which exhibits a tendency of decreasing a timer cycle upon a temperature increase and another tendency of increasing the timer cycle upon a temperature decrease. A diode D has a current characteristic depending upon temperature. A forward current flows through an n-type MOS transistor N1 which forms a primary side of a current mirror. Another current flowing through a p-type MOS transistor P2 and an n-type MOS transistor N3 which form a secondary side of the current mirror is defined depending upon the current flowing through the n-type MOS transistor N1. The current flowing through the p-type MOS transistor P2 and the n-type MOS transistor N3 is supplied as an operating current of a ring oscillator comprising inverters I1~I3. Accordingly, a cycle (timer cycle) of a clock signal CLK outputted from this ring oscillator reflects a temperature characteristic of the diode D, wherein the timer cycle is decreased with increasing the temperature.

27 Claims, 19 Drawing Sheets

TIMER CIRCUIT AND SEMICONDUCTOR MEMORY INCORPORATING THE TIMER CIRCUIT

TECHNICAL FIELD

The present invention relates to a timer circuit and a refresh control circuit having the timer circuit as well as a semiconductor memory device integrating the timer circuit, and more particularly to a word pulse generating circuit.

BACKGROUND ART

DRAM is provided with memory cells, each of which comprises a data storage capacitor and a data transfer transistor. For storing data into the memory cell, a voltage corresponding to a logic value ("1" or "0") of the storage data is applied to the data storage capacitor to store a charge according to this voltage. In this data storage capacitor, a variety of current leak path is present, which causes that the charge accumulated in the data storage capacitor is gradually decreased over times, resulting in a deterioration of the data stored in the memory cell. For this reason, DRAM performs a cyclic or periodic refresh operation for refreshing the data of the memory cells.

There is a variety of refresh methods, for example, a CAS before RAS for supplying, from outside, a necessary signal for refresh and an auto-refresh for refreshing in accordance with an address internally generated upon receiving an externally supplied trigger, and further a self-refresh for automatically refreshing inside. The semiconductor memory device utilizing the above-described self-refresh method integrates a timer circuit for generating a clock signal with a constant cycle, so that the lock signal generated by this timer circuit is counted to obtain a refresh timing without any external control.

A structure of the timer circuit in accordance with the prior art and a method of setting a cycle of the clock signal to be generated by this timer circuit will, hereinafter, be described.

FIG. 1 shows a circuit configuration of the conventional timer circuit. The conventional timer circuit comprises a current mirror circuit, a resistance RR acting as a load to a primary side of this current mirror circuit, a ring oscillator acting as another load to a secondary side of the current mirror circuit and a buffer circuit.

The primary side load resistance RR acting as the load to the primary side of the current mirror circuit is connected at its one terminal to a power supplied from outside. As this primary side load resistance RR, an interconnection material, for example, polysilicon may be used.

The current mirror circuit comprises three n-channel MOS transistors N1~N3 and two p-channel MOS transistors P1 and P2. The current mirror circuit controls a secondary current based on a primary current which flows through the above-described primary side load resistance RR. An input side of the ring oscillator is connected to a secondary side of the current mirror circuit, so that the ring oscillator acts as a load to the secondary side of the current mirror circuit. The ring oscillator comprises three inverters I1~I3 which are connected in ring-shape. Delay-purpose capacitors C1~C3 are respectively connected to output ports of the inverters I1~I3. An input port of the buffer circuit B is connected to an output port of the inverter I3, so that the buffer circuit B receives an input of an oscillation signal outputted from the inverter I3, and outputs a clock signal CLK. In the below-description, a cycle of the clock signal CLK is so called to as "timer cycle".

Sources of the n-channel MOS transistors N1~N3 forming the above-described current mirror circuit are commonly grounded. Gates of these n-channel MOS transistors N1~N3 are connected to a drain of the n-channel MOS transistor N1. The drain of the n-channel MOS transistor N1 is connected to another end of the primary side load resistance RR. A drain of the n-channel MOS transistor N3 is connected to each of ground nodes of the inverters I1~I3. Transconductances gm1 and gm2 of the n-channel MOS transistors N1 and N2 are equal to each other. A transconductance gm3 of the n-channel MOS transistor N3 is set at such an appropriate value as providing a ground potential to the inverters I1~I3. In accordance with the conventional circuit configuration, the transconductance gm3 of the n-channel MOS transistor N3 is larger by integer number times than that of the n-channel MOS transistor N1. The n-channel MOS transistors N1 and N3 constitute the current mirror circuit with the primary side load resistance RR which acts as the load to the primary side thereof for supplying the ground potential to the inverters I1~I3.

Sources of the p-channel MOS transistors P1 and P2 are commonly connected to the power. Gates of the p-channel MOS transistors P1 and P2 are connected to a drain of the p-channel MOS transistor P1. A drain of the p-channel MOS transistor P2 is connected to respective power nodes of the inverters I1~I3. A drain of the p-channel MOS transistor P1 is connected to a drain of the above-described n-channel MOS transistor N2. A transconductance gm5 of the p-channel MOS transistor P2 is set at such an appropriate value as providing a ground potential to the inverters I1~I3. A transconductance gm4 of the p-channel MOS transistor P1 is larger by integer number times than that of the p-channel MOS transistor P2. The p-channel MOS transistors P1 and P2 constitute the current mirror circuit with the above-described n-channel MOS transistor N2 which acts as the load to the primary side thereof for supplying the ground potential to the inverters I1~I3.

Subsequently, an operation of the conventional timer circuit will be described.

If a power voltage externally supplied is constant, then a current flowing through the resistance RR is definitely decided depending upon both a resistance value of this resistance RR and the transconductance gm1 of the n-channel MOS transistor N1. This current flowing through the resistance RR also flows through the n-channel MOS transistor N1. Gates of the n-channel MOS transistors N1~N3 are commonly applied with a voltage which appears at a connection point between the resistance RR and the drain of the n-channel MOS transistor N1. Therefore, ratios of the currents respectively flowing through those n-channel MOS transistors N1~N3 are defined depending upon those transconductances gm. In this example, a current flowing through the n-channel MOS transistor N2 is almost equal to a current flowing through the n-channel MOS transistor N1. A current flowing through the n-channel MOS transistor N3 is larger by an integer time than a current flowing through the n-channel MOS transistor N1.

A current flowing through the p-channel MOS transistor P1 is equal to a current flowing through the n-channel MOS transistor N2 and thus is equal to a current flowing through the resistance RR. The transconductance gm5 of the p-channel MOS transistor P2 is larger by an integer time than that of the p-channel MOS transistor P1. For this reason, the current flowing through the p-channel MOS transistor P2 is larger by an integer time than the current flowing through the p-channel MOS transistor P1, and thus is larger by an integer time than the current flowing through the resistance RR.

As described above, in this timer circuit, a power current supplied to the inverters I1~I2 is controlled by the resistance value of the resistance RR.

A method of setting the timer cycle (the cycle of the clock signal) will subsequently be described by taking an example of using this timer circuit as a timer for refreshing DRAM.

FIG. 2 shows a temperature dependency of the timer cycle of the conventional timer circuit. A horizontal axis represents a temperature T(° C.), while a vertical axis represents a variation ΔF(%) of the timer cycle. The timer cycle variation ΔF(%) shows a tendency of a gentle and linear increase upon temperature increase. In a temperature range of −30° C. to 90° C., the increase of the timer cycle variation ΔF(%) tends to be generally gentle. Such characteristic is due to a temperature-characteristic of the resistance RR. In general, in case of DRAM utilizing a specification providing a refresh cycle from outside, a flat characteristic of the timer circuit providing the refresh timing is preferable as shown in FIG. 2. This is generally caused by the fact that a cycle of a signal given from outside for refresh operation does not accord to the temperature characteristic of the semiconductor memory device.

If the power voltage (VDD) is high, then a voltage at a memory node of the memory cell is high, which causes an increase in leakage of current, whereby a data hold characteristic of the memory cell tends to show a flat characteristic. If the data hold characteristic of the memory cell has the flat characteristic with reference to the power voltage, then it is preferable that the timer circuit has a flat characteristic as shown in FIG. 2.

For designing a semiconductor memory device integrating a timer circuit for refresh, the timer cycle is so set that, in consideration of a power voltage variation and a temperature variation, the refresh operation is ensured under a most strict condition in view of voltage and temperature. Namely, as shown in FIG. 2, as the temperature is high and the voltage is high, the timer cycle is long and the refresh operation condition is strict. Thus, it is necessary to ensure the refresh operation under such the strict operation condition. For this reason, the timer cycle is set to obtain a necessary time interval for refresh under operation conditions (worst conditions) that the temperature is highest and the power voltage is also highest.

The semiconductor memory device integrating the timer circuit in accordance with the above-described prior art tends to show an increase of the timer cycle upon temperature increase. If the timer cycle is so set as to ensure the refresh operation under the worst condition (high temperature), then under other conditions than the worst conditions, for example, the typical conditions, the timer cycle is shorter than that under the worst conditions.

In general, the data hold characteristic of the memory cell tends to be deteriorated as temperature is high, for which reason it is necessary that the time interval for refresh operations is shorter by temperature increase. As the temperature is low, the time interval for refresh operations may be long. If the timer cycle is set to adjust to the worst conditions, then at a lower temperature than the high temperature of the worst condition, for example, at an ordinary or low temperature, the timer cycle is shorter than that under the worst condition, whereby the refresh operations will be made at an excess frequency, and such excess refresh operation causes an unnecessary current comsumption.

DISCLOSURE OF THE INVENTION

The present invention has been made in view of the above circumstances. A first object of the present invention is to provide a novel timer circuit free of the above-described problems.

A second object of the present invention is to provide a novel timer circuit showing a tendency of decreasing a timer cycle upon temperature increase and another tendency of increasing the timer cycle upon temperature decrease.

A third object of the present invention is to provide a semiconductor memory device which ensures refresh operations under worst conditions and suppresses any excess refresh operation under other conditions than the worst conditions.

A fourth object of the present invention is to provide a refresh operation control circuit which ensures refresh operations under worst conditions and suppresses any excess refresh operation under other conditions than the worst conditions.

A fifth object of the present invention is to provide a word pulse generating circuit which ensures refresh operations under worst conditions and suppresses any excess refresh operation under other conditions than the worst conditions.

A sixth object of the present invention is to provide a semiconductor integrated circuit which ensures refresh operations under worst conditions and suppresses any excess refresh operation under other conditions than the worst conditions.

A seventh object of the present invention is to provide a clock signal cycle control circuit which controls a clock signal generating circuit so as to show a tendency of decreasing a timer cycle upon temperature increase and another tendency of increasing the timer cycle upon temperature decrease.

In order to solve the above issues, the present invention has the following configurations.

A timer circuit in accordance with the present invention is a timer circuit comprising a power circuit for generating a power current provided with a temperature-dependency; and a clock generating circuit being electrically coupled to an output side of the power circuit for generating a clock signal with a cycle depending upon temperature from the power current.

Upon temperature increase, the power circuit increases the power current to decrease a clock cycle, and upon temperature decrease, the power circuit decreases the power current to increase the clock cycle.

The power circuit may comprise a current mirror circuit; and a temperature-dependency providing circuit being electrically coupled to a primary side of the current mirror circuit for supplying a primary current with a temperature-dependency to the current mirror circuit, and the current mirror circuit generates, in its secondary side, a power current provided with a temperature-dependency in accordance with the primary current with the temperature-dependency.

The temperature-dependency providing circuit may include a rectifying device with a temperature-dependent current characteristic.

The temperature-dependency providing circuit may comprise a series connection of at least one diode showing a temperature-dependent current characteristic and at least one resistance.

The temperature-dependency providing circuit may comprise a circuit with a constant temperature-dependency.

The temperature-dependency providing circuit may comprise a circuit with a variable temperature-dependency.

The temperature-dependency providing circuit may comprise a series connection of a plurality of diode showing a temperature-dependent current characteristic and at least one resistance, and the number of the diodes connected in series and acting as rectifying devices is variable.

At least one of the plurality of diode may be connected in parallel to a by-pass including a switching device to vary the number of the diodes on a current path.

The temperature-dependency providing circuit may have a function of varying a current value depending upon temperature and another function of varying the current independent from temperature with controlling the current value based on a control signal.

The temperature-dependency providing circuit may include a series connection of a rectifying device with a temperature-dependent current characteristic and a variable resistance circuit varying in resistance value based on the control signal.

The temperature-dependency providing circuit may comprise a series connection of a plurality of diode showing a temperature-dependent current characteristic and at least one resistance, and the number of the diodes connected in series and acting as rectifying devices is variable.

At least one of the plurality of diode may be connected in parallel to a by-pass including a switching device to vary the number of the diodes on a current path.

The timer circuit may further include a clock signal cycle varying circuit being electrically coupled to an output side of the clock generating circuit for varying a cycle of a first clock signal outputted from the clock generating circuit and outputting a second clock signal different in cycle from the first clock signal; and a selecting circuit being electrically connected to an output side of the clock generating circuit and also connected to an output side of the clock signal cycle varying circuit for selecting and outputting one of the first clock signal and the second clock signal.

The clock signal cycle varying circuit may comprise a binary counter dividing a frequency of the first clock signal and outputting the second clock signal different in cycle from the first clock signal.

The selecting circuit may comprise a multiplexer selecting and outputting one of the first clock signal and the second clock signal.

The timer circuit may further include a constant voltage generating circuit for generating a constant voltage from the power voltage, and the power circuit is electrically coupled to an output side of the constant voltage generating circuit, so that the power current being provided with the temperature-dependency and being independent from any variation of the power voltage is generated from the constant voltage outputted from the constant voltage generating circuit.

The power circuit may be directly connected to an output side of the constant voltage generating circuit.

The power circuit may be electrically connected to an output side of the constant voltage generating circuit through a circuit element which falls a level of the constant voltage outputted from the constant voltage generating circuit.

The circuit element which falls the level of the constant voltage may comprise a field effect transistor being connected in series between the power voltage and the temperature-dependency providing circuit, and its gate is electrically coupled to an output side of the constant voltage generating circuit.

The circuit element which falls the level of the constant voltage may comprise a bipolar transistor with a collector electrically coupled to the power voltage, an emitter electrically coupled to the temperature-dependency providing circuit, and a base electrically coupled to the output side of the constant voltage generating circuit.

The timer circuit may further include a level shifter being electrically coupled to the output side of the clock generating circuit for adjusting a voltage level of the clock signal.

The power circuit may comprise a first power circuit for generating a power current provided with a temperature-dependency from the power voltage, and a second power circuit being electrically coupled to an output side of a constant voltage generating circuit for generating a power current provided with a temperature-dependency from the constant voltage outputted from the constant voltage generating circuit.

The first power circuit may comprise a first current mirror circuit and a first temperature-dependency providing circuit being electrically coupled to a primary side the first current mirror circuit for supplying a primary current with a temperature dependency to the first current mirror circuit, and the first temperature-dependency providing circuit generates, from the power voltage and in its secondary side, a power current with a temperature-dependency according to a primary current with a temperature-dependency, and the second power circuit comprises a second current mirror circuit and a second temperature-dependency providing circuit being electrically coupled to a primary side the second current mirror circuit for supplying a primary current with a temperature dependency to the second current mirror circuit, and the second temperature-dependency providing circuit generates a power current with a temperature-dependency from the constant voltage outputted from the constant voltage generating circuit and in its secondary side.

The temperature-dependency providing circuit may comprise a series connection of a plurality of rectifying device having a temperature-dependent current characteristic and a resistance.

The temperature-dependency providing circuit may comprise a second current mirror circuit including at least one rectifying device having a temperature-dependent current characteristic.

A primary side of the second current mirror circuit may have at least one resistance and a secondary side thereof has at least one diode.

The primary side of the second current mirror circuit may be connected through a switching transistor to the power voltage and a control terminal of the switching transistor may be electrically coupled to an output side of the constant voltage generating circuit.

The constant voltage generating circuit may comprise a band gap circuit.

The power circuit may further include a compensation current supplying circuit being electrically coupled to a primary side of the current mirror circuit for supplying a compensating current independent from temperature to the primary side of the current mirror circuit.

Further, the present invention provides a refresh control circuit including: an address counter generating an address for refresh and a timer circuit for timing a time interval for refresh, wherein the timer circuit comprises a power circuit for generating a power current provided with a temperature-dependency; and a clock generating circuit being electrically coupled to an output side of the power circuit for generating a clock signal with a cycle depending upon temperature from the power current.

The timer circuit may be reset and may re-start timing operation upon an input of a signal which detects an address transition.

Upon temperature increase, the power circuit may increase the power current to decrease a clock cycle, and upon temperature decrease, the power circuit may decrease the power current to increase the clock cycle.

The power circuit may comprise a current mirror circuit; and a temperature-dependency providing circuit being electrically coupled to a primary side of the current mirror circuit for supplying a primary current with a temperature-dependency to the current mirror circuit, and the current mirror circuit generates, in its secondary side, a power current provided with a temperature-dependency in accordance with the primary current with the temperature-dependency.

The temperature-dependency providing circuit may include a rectifying device with a temperature-dependent current characteristic.

Further, the present invention provides a semiconductor memory device including: a memory cell array; and at least one timer circuit for generating a clock signal which gives a refresh operation timing for periodically refreshing data stored in memory cells in the memory cell array, wherein the timer circuit comprises a power circuit for generating a power current provided with a temperature-dependency; and a clock generating circuit being electrically coupled to an output side of the power circuit for generating a clock signal with a cycle depending upon temperature from the power current.

The timer circuit may reset and may re-start timing operation upon an input of a signal which detects an address transition.

Upon temperature increase, the power circuit may increase the power current to decrease a clock cycle, and upon temperature decrease, the power circuit may decrease the power current to increase the clock cycle.

The power circuit may comprise a current mirror circuit; and a temperature-dependency providing circuit being electrically coupled to a primary side of the current mirror circuit for supplying a primary current with a temperature-dependency to the current mirror circuit, and the current mirror circuit generates, in its secondary side, a power current provided with a temperature-dependency in accordance with the primary current with the temperature-dependency.

The temperature-dependency providing circuit may include at lest a rectifying device with a temperature-dependent current characteristic.

Further, the present invention provides a semiconductor device including at least one timer circuit for generating a clock signal which gives an operation timing, wherein the timer circuit comprises a power circuit for generating a power current provided with a temperature-dependency; and a clock generating circuit being electrically coupled to an output side of the power circuit for generating a clock signal with a cycle depending upon temperature from the power current.

The timer circuit may reset and may re-start timing operation upon an input of a signal which detects an address transition.

Upon temperature increase, the power circuit may increase the power current to decrease a clock cycle, and upon temperature decrease, the power circuit may decrease the power current to increase the clock cycle.

The power circuit may comprise a current mirror circuit; and a temperature-dependency providing circuit being electrically coupled to a primary side of the current mirror circuit for supplying a primary current with a temperature-dependency to the current mirror circuit, and the current mirror circuit generates, in its secondary side, a power current provided with a temperature-dependency in accordance with the primary current with the temperature-dependency.

The temperature-dependency providing circuit may include at lest a rectifying device with a temperature-dependent current characteristic.

Further, the present invention provides a pulse generating circuit comprising a power circuit for generating a power current provided with a temperature-dependency; and a pulse generating circuit being electrically coupled to an output side of the power circuit for generating a pulse signal with a cycle depending upon temperature from the power current.

Upon temperature increase, the power circuit may increase the power current to decrease a pulse cycle, and upon temperature decrease, the power circuit may decrease the power current to increase the pulse cycle.

The power circuit may comprise a current mirror circuit; and a temperature-dependency providing circuit being electrically coupled to a primary side of the current mirror circuit for supplying a primary current with a temperature-dependency to the current mirror circuit, and the current mirror circuit generates, in its secondary side, a power current provided with a temperature-dependency in accordance with the primary current with the temperature-dependency.

The temperature-dependency providing circuit may include a rectifying device with a temperature-dependent current characteristic.

The temperature-dependency providing circuit may comprise a series connection of at least one diode showing a temperature-dependent current characteristic and at least one resistance.

The temperature-dependency providing circuit may comprise a circuit with a constant temperature-dependency.

The temperature-dependency providing circuit may comprise a circuit with a variable temperature-dependency.

The temperature-dependency providing circuit may comprise a series connection of a plurality of diode showing a temperature-dependent current characteristic and at least one resistance, and the number of the diodes connected in series and acting as rectifying devices is variable.

At least one of the plurality of diode may be connected in parallel to a by-pass including a switching device to vary the number of the diodes on a current path.

The temperature-dependency providing circuit may have a function of varying a current value depending upon temperature and another function of varying the current independent from temperature with controlling the current value based on a control signal.

The temperature-dependency providing circuit may include a series connection of a rectifying device with a temperature-dependent current characteristic and a variable resistance circuit varying in resistance value based on the control signal.

The temperature-dependency providing circuit may comprise a series connection of a plurality of diode showing a temperature-dependent current characteristic and at least one resistance, and the number of the diodes connected in series and acting as rectifying devices is variable.

At least one of the plurality of diode may be connected in parallel to a by-pass including a switching device to vary the number of the diodes on a current path.

The pulse generating circuit may further include a pulse signal cycle varying circuit being electrically coupled to an output side of the pulse generating circuit for varying a cycle of a first pulse signal outputted from the pulse generating circuit and outputting a second pulse signal different in cycle from the first pulse signal; and a selecting circuit being electrically connected to an output side of the pulse generating circuit and also connected to an output side of the pulse signal cycle varying circuit for selecting and outputting one of the first pulse signal and the second pulse signal.

The pulse signal cycle varying circuit may comprise a binary counter dividing a frequency of the first pulse signal and outputting the second pulse signal different in cycle from the first pulse signal.

The selecting circuit may comprise a multiplexer selecting and outputting one of the first pulse signal and the second pulse signal.

The pulse generating circuit may further include a constant voltage generating circuit for generating a constant voltage from the power voltage, and the power circuit is electrically coupled to an output side of the constant voltage generating circuit, so that the power current being provided with the temperature-dependency and being independent from any variation of the power voltage is generated from the constant voltage outputted from the constant voltage generating circuit.

The power circuit may be directly connected to an output side of the constant voltage generating circuit.

The power circuit may be electrically connected to an output side of the constant voltage generating circuit through a circuit element which falls a level of the constant voltage outputted from the constant voltage generating circuit.

The circuit element which falls the level of the constant voltage may comprise a field effect transistor being connected in series between the power voltage and the temperature-dependency providing circuit, and its gate is electrically coupled to an output side of the constant voltage generating circuit.

The circuit element which falls the level of the constant voltage may comprise a bipolar transistor with a collector electrically coupled to the power voltage, an emitter electrically coupled to the temperature-dependency providing circuit, and a base electrically coupled to the output side of the constant voltage generating circuit.

The pulse generating circuit may further include a level shifter being electrically coupled to the output side of the pulse generating circuit for adjusting a voltage level of the pulse signal.

The power circuit may comprise a first power circuit for generating a power current provided with a temperature-dependency from the power voltage, and a second power circuit being electrically coupled to an output side of a constant voltage generating circuit for generating a power current provided with a temperature-dependency from the constant voltage outputted from the constant voltage generating circuit.

The first power circuit may comprise a first current mirror circuit and a first temperature-dependency providing circuit being electrically coupled to a primary side the first current mirror circuit for supplying a primary current with a temperature dependency to the first current mirror circuit, and the first temperature-dependency providing circuit generates, from the power voltage and in its secondary side, a power current with a temperature-dependency according to a primary current with a temperature-dependency, and the second power circuit comprises a second current mirror circuit and a second temperature-dependency providing circuit being electrically coupled to a primary side the second current mirror circuit for supplying a primary current with a temperature dependency to the second current mirror circuit, and the second temperature-dependency providing circuit generates a power current with a temperature-dependency from the constant voltage outputted from the constant voltage generating circuit and in its secondary side.

The temperature-dependency providing circuit may comprise a series connection of a plurality of rectifying device having a temperature-dependent current characteristic and a resistance.

The temperature-dependency providing circuit may comprise a second current mirror circuit including at least one rectifying device having a temperature-dependent current characteristic.

A primary side of the second current mirror circuit may have at least one resistance and a secondary side thereof has at least one diode.

The primary side of the second current mirror circuit may be connected through a switching transistor to the power voltage and a control terminal of the switching transistor may be electrically coupled to an output side of the constant voltage generating circuit.

The constant voltage generating circuit may comprise a band gap circuit.

The power circuit may further include a compensation current supplying circuit being electrically coupled to a primary side of the current mirror circuit for supplying a compensating current independent from temperature to the primary side of the current mirror circuit.

Further, the present invention provides a word pulse generating circuit for generating a word pulse for driving a word line, wherein the word pulse generating circuit includes a delay circuit which comprises a power circuit for generating a power current provided with a temperature-dependency; and an inverter chain being electrically coupled to an output side of the power circuit for generating a word pulse with a pulse width depending upon temperature from the power current.

Upon temperature increase, the power circuit may increase the power current to decrease a pulse cycle, and upon temperature decrease, the power circuit may decrease the power current to increase the pulse cycle.

The power circuit may comprise a current mirror circuit; and a temperature-dependency providing circuit being electrically coupled to a primary side of the current mirror circuit for supplying a primary current with a temperature-dependency to the current mirror circuit, and the current mirror circuit generates, in its secondary side, a power current provided with a temperature-dependency in accordance with the primary current with the temperature-dependency.

The temperature-dependency providing circuit may include at least a rectifying device with a temperature-dependent current characteristic.

BEST MODE FOR CARRYING OUT THE INVENTION

Embodiments of the present invention will, hereafter, be described with reference to drawings.

Embodiment 1

A timer circuit in accordance with the embodiment 1 comprises a power circuit generating a power current provided with a temperature-dependency, and a clock generating circuit connected to an output side of the power circuit for generating a clock signal CLK with a cycle depending upon temperature.

The power circuit may comprise a current mirror circuit; and a temperature-dependency providing circuit being electrically coupled to a primary side of the current mirror circuit for supplying a primary current with a temperature-dependency to the current mirror circuit, and the current mirror circuit generates, in its secondary side, a power current provided with a temperature-dependency in accordance with the primary current with the temperature-dependency.

The temperature-dependency providing circuit may comprise a circuit with a temperature-dependent current characteristic. For example, the temperature-dependency providing circuit may comprise a series connection of at least one diode showing a temperature-dependent current characteristic and at least one resistance.

Further, a rectifying device having a temperature-dependent current characteristic may comprise one or plural diodes D connected in series which show a temperature-dependent current characteristic.

The clock generating circuit may comprise a ring oscillator connected to an output side of the power circuit or a secondary side of the current mirror circuit for acting as a load to the secondary side of the current mirror circuit, and a buffer circuit B connected to an output side of the ring oscillator for generating a clock signal CLK with a temperature-dependent cycle.

The timer circuit in accordance with the embodiment 1 is applicable to circuits of any types such as semiconductor integrated circuits and semiconductor memory devices. In the embodiment 1, the timer circuit is applied to a pseudo SRAM as one example of the semiconductor memory devices, wherein the pseudo SRAM uses the same memory cells as DRAM (dynamic random access memory) and operates in the same specification as SRAM (static random access memory). A refresh operation is made periodically based on a periodical generation of a refresh timing from an internal circuit. The semiconductor memory device is thus provided with a timer circuit for timing a time interval of refresh timing for self-refresh operation.

This semiconductor memory device also detects any transition of address signals externally given and generates a pulse signal as a trigger for refresh operation and read/write operations in the same cycle. In this invention, "read/write operations" are opposite in conception to "refresh operation" and mean normal "read operation" or "write operation".

Figure 3:
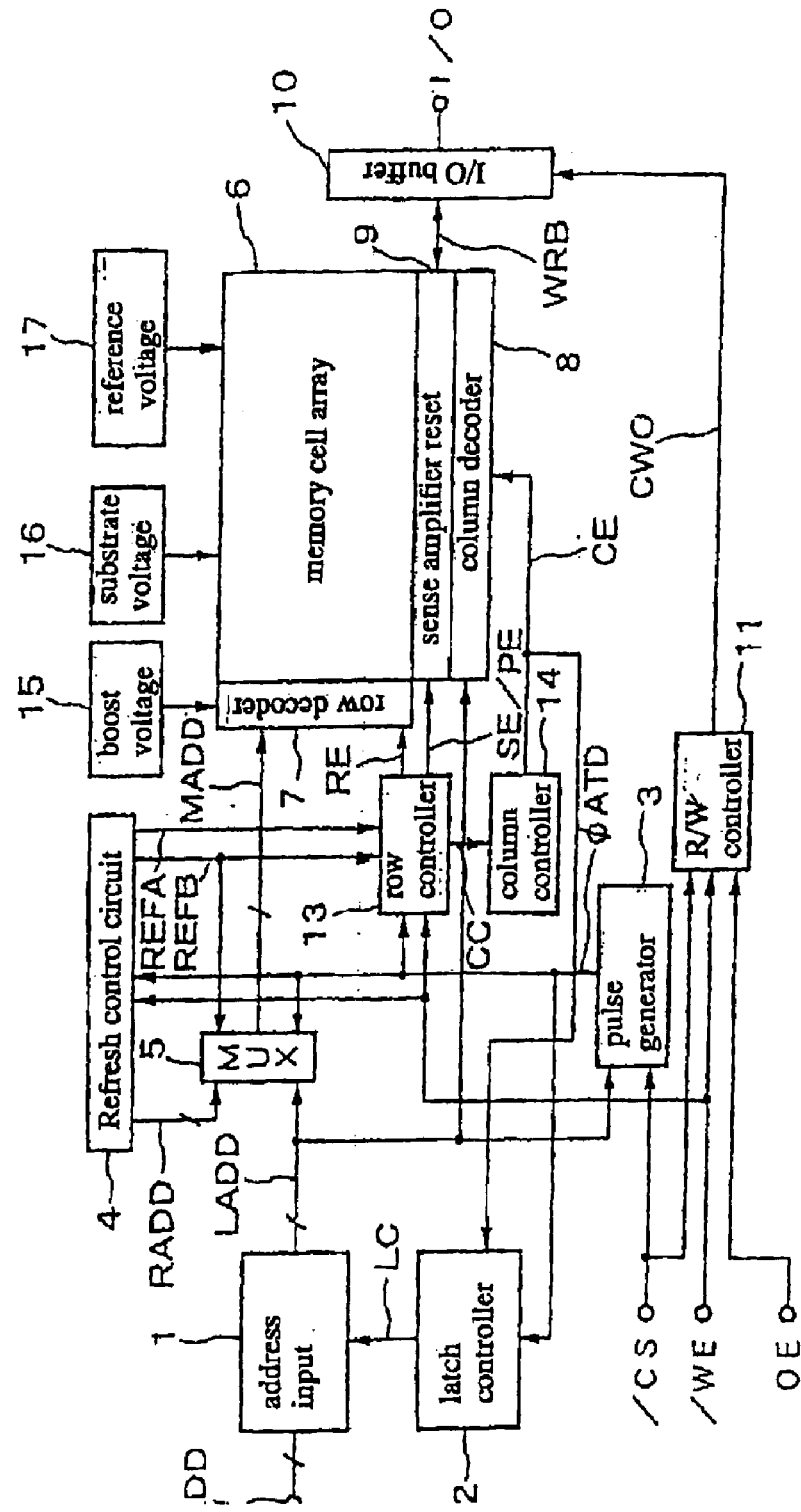
FIG. 3 is a block diagram showing a whole configuration of a semiconductor memory device provided with a timer circuit in accordance with a first embodiment of the present invention.

FIG. 3 shows a whole configuration of the semiconductor memory device in accordance with this embodiment. The semiconductor memory device has the following circuit elements in addition to a memory cell array 6.

An address signal ADD is an address signal given from the outside, and includes a row address for designating a row of the memory cell array and a column address for designating a column of the memory cell array. The semiconductor memory device has an address input system 1. The address input system 1 receives an address signal ADD entered from outside and latches the address signal ADD to generate an internal address signal LADD. This internal address signal LADD will, hereinafter, be referred to as "latch address signal".

The semiconductor memory device further has a pulse generator 3. This pulse generator 3 has a first input port connected to an input port for a chip select signal/CS for receiving an input of the chip select signal/CS, and a second input port connected to an output port of the address input system 1 for receiving an input of the latch address LADD. When the chip select signal/CS is in an activated state, the pulse generator 3 detects a transition of the latch address LADD and outputs, from its output port, an address transition detection signal φ A/D which comprises positive one-shot pulse. The chip select signal/CS is a most significant control signal for controlling operational state of the semiconductor memory device. If the chip select signal/CS is high level "H", the semiconductor memory device is in the stand-by state. If the chip select signal/CS is low level "L", the semiconductor memory device is in the active state.

The semiconductor memory device further has a refresh control circuit 4. This refresh control circuit 4 has a first input port connected to a write enable signal input port for receiving a write enable signal/WE externally entered, and a second input port connected to an output port of the pulse generator 3 for receiving an input of the address transition detection signal φ ATD as outputted from the output port of the pulse generator 3.

This refresh control circuit 4 integrates an address counter for generating an address for refresh RADD (hereinafter referred to as "refresh address") which designates a row of the memory cell array in the refresh operation, and a timer circuit for timing a time interval of the refresh. This refresh control circuit 4 automatically generates, at a predetermined timing, the refresh address RADD based upon the address transition detection signal φ ATD outputted from the pulse generator 3 and the write enable signal/WE externally given, and outputs the refresh address RADD from a first output port thereof. The refresh address RADD realizes the refresh operation similar to the self-refresh in the general DRAM. The above-described timer circuit is used for timing the time interval of the self-refresh operations.

Concretely, the refresh control circuit 4 times a passing time from a final access request made from outside and if the passing time becomes over a predetermined refresh time, then the refresh control circuit 4 starts internally the self-refresh. Every when the address transition detection signal φ ATD of the positive pulse is outputted from the pulse generator 3, the timer circuit is reset and re-starts timing operation. The timer circuit also first and second refresh control signals REFA and REFB for controlling the refresh timing and outputs them from second and third output ports respectively. The first refresh control signal REFA is a signal for controlling that the refresh should be made upon an external access request. If this signal is high level "H", then the refresh is made. If this signal is low level "L", then the refresh is not made. The second refresh control signal REFB is a signal to be used for controlling the self-refresh operation. If a negative one-shot pulse is generated as the second refresh control signal REFB, then the self-refresh is started.

The semiconductor memory device further has an address multiplexer (MUX) 5. This address multiplexer (MUX) 5 has four input ports and one output port. A first input port of the address multiplexer (MUX) 5 is connected to a first output port of the refresh control circuit 4 for receiving an input of the refresh address RADD outputted automatically at the predetermined timing from the refresh control circuit 4. A second input port of the address multiplexer (MUX) 5 is connected to the output port of the address input system 1 for receiving an input of the latch address LADD outputted from the output port of the address input system 1. A third input port of the address multiplexer (MUX) 5 is connected to the third output port of the refresh control circuit 4 for receiving an input of the second refresh control signal REFB outputted from the refresh control circuit 4. A fourth input port of the address multiplexer (MUX) 5 is connected to the output port of the pulse generator 3 for receiving an input of the address transition detection signal φ ATD outputted from the output port of the pulse generator 3.

The address multiplexer (MUX) 5 selects the latch address LADD or the refresh address RADD in accordance with levels of the address transition detection signal φ ATD and the second refresh control signal REFB, and outputs the selected one as an address MADD from the output port thereof If the address transition detection signal φ ATD is low level "L" and the second refresh control signal REFB is high level "H", then after a predetermined time passes from rising the address transition detection signal φ ATD, the address multiplexer (MUX) 5 selects a row address included in the latch address LADD and outputs selected one as the address MADD. If the address transition detection signal φ ATD is high level "H" or if the second refresh control signal REFB is low level "L", then after a predetermined time passes from falling the address transition detection signal φ ATD, the address multiplexer (MUX) 5 selects the refresh address RADD and outputs the refresh address RADD as the address MADD.

Similarly to the general DRAM, the memory cell array 6 comprises a matrix array of dynamic type memory cells, each comprising a set of one data storage capacitor and one data transfer transistor. Word lines run in its row direction, while bit lines (or bit line pairs) run in its column direction. The memory cell is positioned at a crossing point of the word line and the bit line.

A row decoder 7 is connected to the output port of the address multiplexer (MUX) 5 for receiving an input of he address MADD outputted from the address multiplexer (MUX) 5. If the row enable signal RE is high level "H", then the row decoder 7 decodes the address MADD and drives a word line belonging to a row designated by this address MADD into high level "H".

If a column enable signal CE is high level "H", then a column decoder 8 decodes a column address included in the latch address LADD and generates a column selecting signal which selects a bit line belonging to a column designated by this column address.

The semiconductor memory device, further, has a sense amplifier reset circuit 9. This sense amplifier reset circuit 9 comprises a sense amplifier column switch and a pre-charge circuit, which are not illustrated in the drawing. The column switch connects between a sense amplifier designated by the column selecting signal outputted from the column decoder 8 and a bus WRB. If a sense enable signal SE is high level "H", the sense amplifier senses and amplifies a potential of the bit line for output to the bus WRB for read operation, and writes a write data supplied through the bus WRB into the memory cell. If a pre-charge enable signal PE is high level "H", then the pre-charge circuit pre-charges the potential of the bit line to a predetermined potential, for example, a potential of ½ of a power voltage Vdd. An I/O buffer (input/output buffer) 10 performs data input/output to and from outside in accordance with a level of a control signal CWO.

The semiconductor memory device, further, has a R/W (read/write) control circuit 11. The R/W control circuit 11 has first to third input ports connected to a chip select signal input port, a write enable signal input port and an output enable signal input port respectively for receiving inputs of a chip select signal/CS, a write enable signal/WE and an output enable signal OE which are entered from outside. The R/W control circuit 11 generates the control signal CWO for controlling the read operation and the write operation, based on the inputted chip select signal/CS, the write enable signal/WE and the output enable signal OE, and outputs the control signal CWO from the output port thereof. The output port of the R/W control circuit 11 is connected to a control unit of the I/O buffer 10 so that the control signal CWO is inputted into the control unit of the I/O buffer 10. The I/O buffer 10 performs the data input/output to and from outside based on the level of the control signal CWO.

The semiconductor memory device, further, has a latch control circuit 12. This latch control circuit 12 has an input port connected to the output port of the pulse generator 3 for receiving an input of the address transition detection signal φ ATD outputted from the pulse generator 3. The latch control circuit 12 generates a latch control signal LC of a positive one-shot pulse by triggering a fall edge of the inputted address transition detection signal φ ATD and outputs the latch control signal LC from an output port thereof.

The output port of the latch control circuit 12 is connected to a control unit of the address input system 1 so that the latch control signal LC outputted from the output port of the latch control circuit 12 is inputted into the control unit of the address input system 1. The address input system 1 latches the externally inputted address signal ADD based on the inputted latch control signal LC to generates the internal address signal LADD.

The semiconductor memory device, further, has a row control circuit 13. This row control circuit 13 has fourth input ports and three output ports. A first input port of the row control circuit 13 is connected to the output port of the pulse generator 3 for receiving an input of the address transition detection signal φ ATD outputted from the output port of the pulse generator 3. A second input port of the row control circuit 13 is connected to the write enable signal input port for receiving an externally inputted write enable signal/WE. A third input port of the row control circuit 13 is connected to the second output port of the refresh control circuit for receiving an input of the first refresh control signal REFA outputted from the second output port of the refresh control circuit. A fourth input port of the row control circuit 13 is connected to the third output port of the refresh control circuit for receiving an input of the second refresh control signal REFB outputted from the third output port of the refresh control circuit.

This row control circuit 13 generates the row enable signal RE, the sense amplifier enable signal SE, the pre-charge enable signal PE and the control signal CC based on the first and second refresh control signals REFA and REFB and the address transition detection signal φ ATD and the write enable signal/WE.

A first output port of the row control circuit 13 is connected to the row decoder 7 for outputting the row enable signal RE. The row enable signal RE outputted from the first output port of the row control circuit 13 is inputted into the row decoder 7. If the row enable signal RE is high level "H", then the row decoder 7 decodes the address MADD for driving, into high level "H", a word line belonging to a row designated by this address MADD.

A second output port of the row control circuit 13 is connected to the sense amplifier reset circuit 9 for outputting the sense amplifier enable signal SE and the pre-charge enable signal PE. The sense amplifier enable signal SE outputted from the second output port of the row control circuit 13 is inputted into a sense amplifier forming the sense amplifier reset circuit 9. If the sense amplifier enable signal SE is high level "H", then the sense amplifier senses and amplifies a potential of the bit line for output to the bus WRB for read operation, and writes a write data supplied through the bus WRB into the memory cell for write operation.

The pre-charge enable signal PE outputted from the second output port of the row control circuit 13 is inputted into a pre-charge circuit forming the sense amplifier reset circuit 9. If the pre-charge enable signal PE is high level "H", then the pre-charge circuit pre-charges the potential of the bit line to a predetermined potential, for example, a potential of ½ of a power voltage Vdd.

The third output port of the row control circuit 13 outputs the control signal CC.

The semiconductor memory device, further, has a column control circuit 14. This column control circuit 14 has an input port connected to the third output port of the row control circuit 13 for receiving an input of the control signal CC outputted from the third output port of the row control circuit 13. The column control circuit 14 generates a column enable signal CE from the inputted control signal CC and outputs the column enable signal CE from its output port. The output port of the column control circuit 14 is connected to the column decoder 8 so that the column enable signal CE outputted from the output port of the column control circuit 14 is inputted into the column decoder 8. If the column enable signal CE is high level "H", then the column decoder 8 decodes a column address included in the latch address LADD and generates a column selecting signal which selects a bit line belonging to a column designated by this column address.

The semiconductor memory device, further, has a boost power 15. This boost power 15 is connected to the row decoder 7 for supplying a boost voltage, which is intended to be applied to the word line in the memory cell array 6, into the row decoder 7. If the row enable signal RE is high level "H", then the row decoder 7 drives the word line belonging to the row designated by the decoded address MADD into a high level "H" given by the boost voltage supplied from the boost power 15.

The semiconductor memory device, further, has a refresh voltage generating circuit 17. This refresh voltage generating circuit 17 is connected to the memory cell array 6 and the sense amplifier reset circuit 9 for generating a refresh voltage which is supplied to the memory cell array 6 and the sense amplifier reset circuit 9.

The timer circuit integrated in the refresh control circuit 4 as the characteristic part of this embodiment 1 will subsequently be described with reference to FIG. 4.

Figure 4:
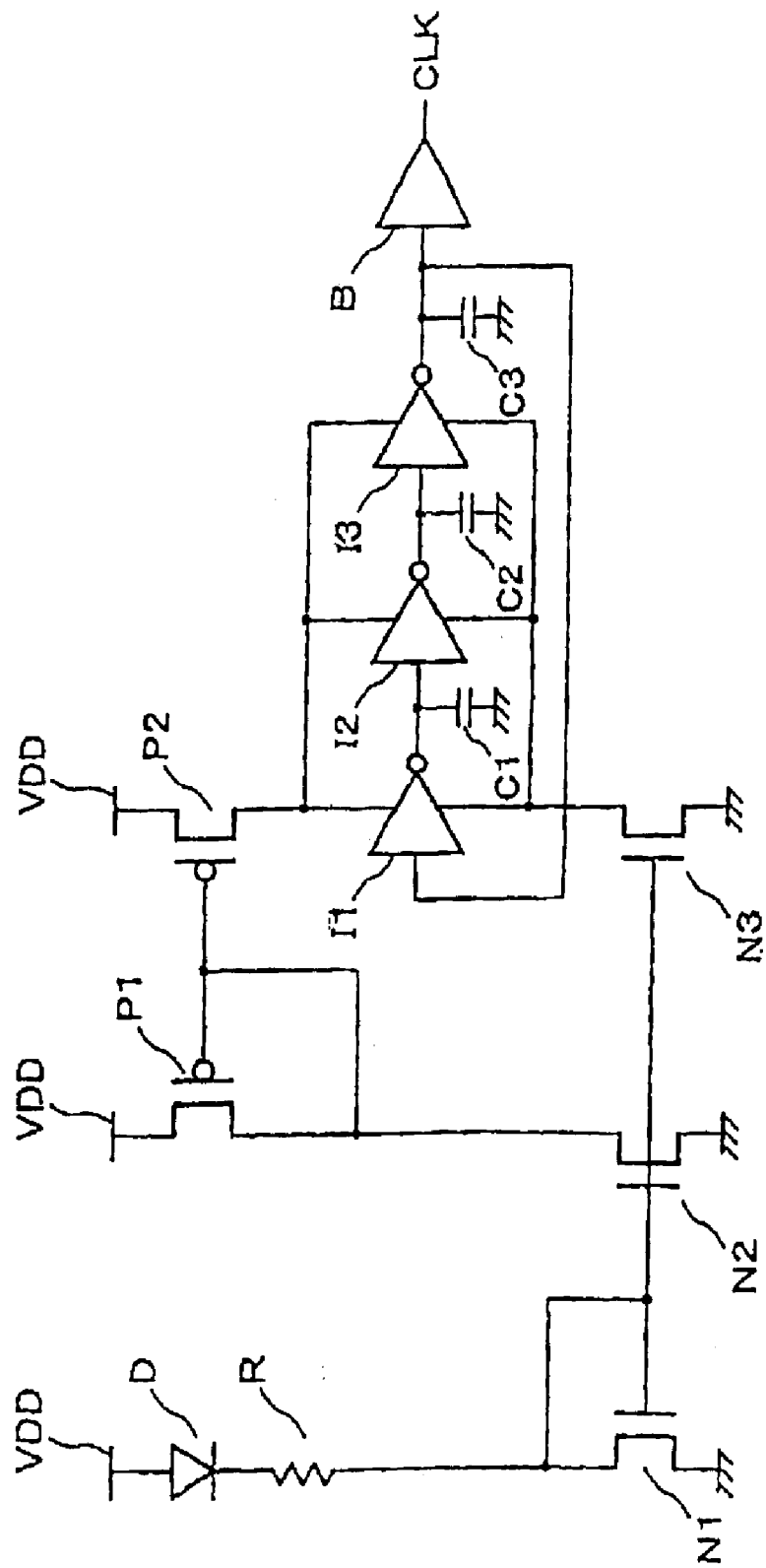
FIG. 4 is a block diagram showing a configuration of the timer circuit in accordance with the first embodiment of the present invention.

The timer circuit shown in FIG. 4 generates a clock signal which provides a timing for refresh operation. A cycle of the clock signal generated by this timer circuit has a temperature dependency. The timer circuit generating the clock signal with the temperature-dependent cycle is different in circuit configuration from the prior art timer circuit shown in FIG. 1.

Figure 1:
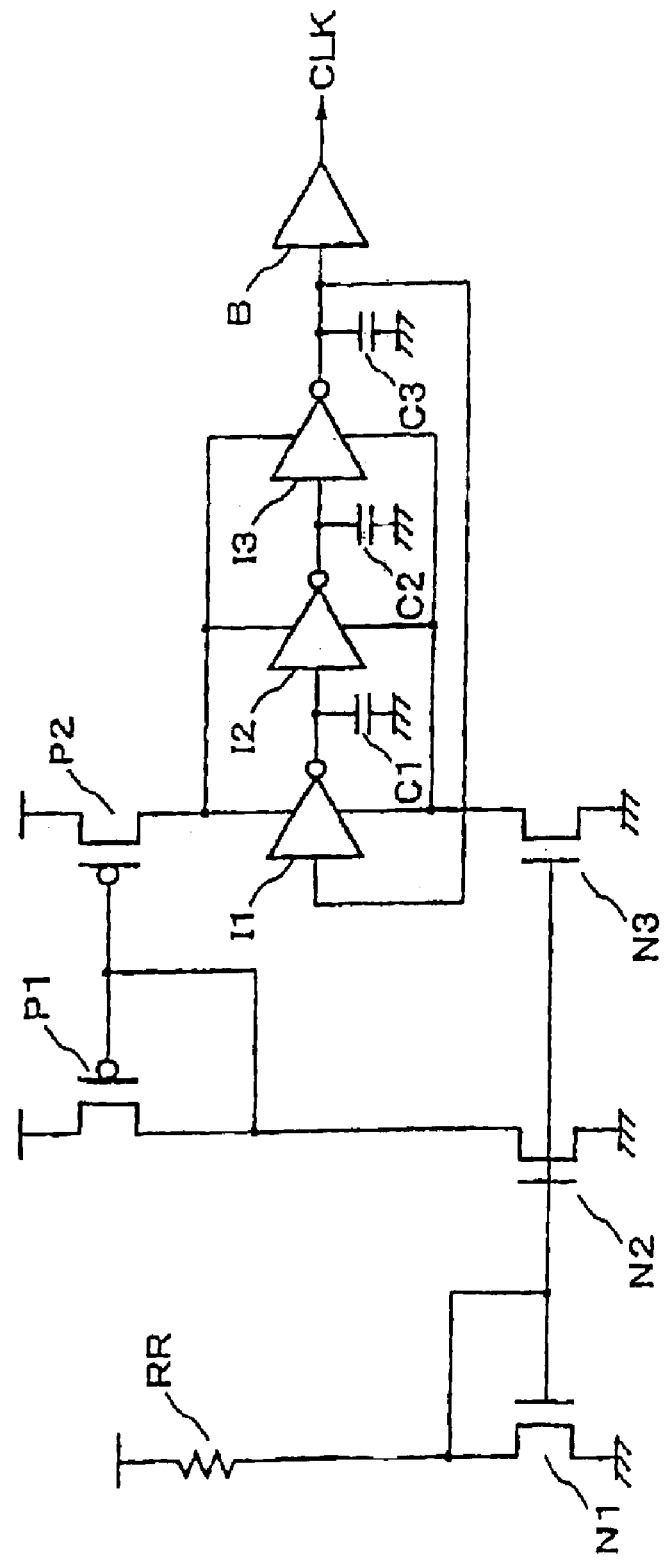
FIG. 1 is a view showing an example of configuration of a timer circuit of the prior art.
Figure 2:
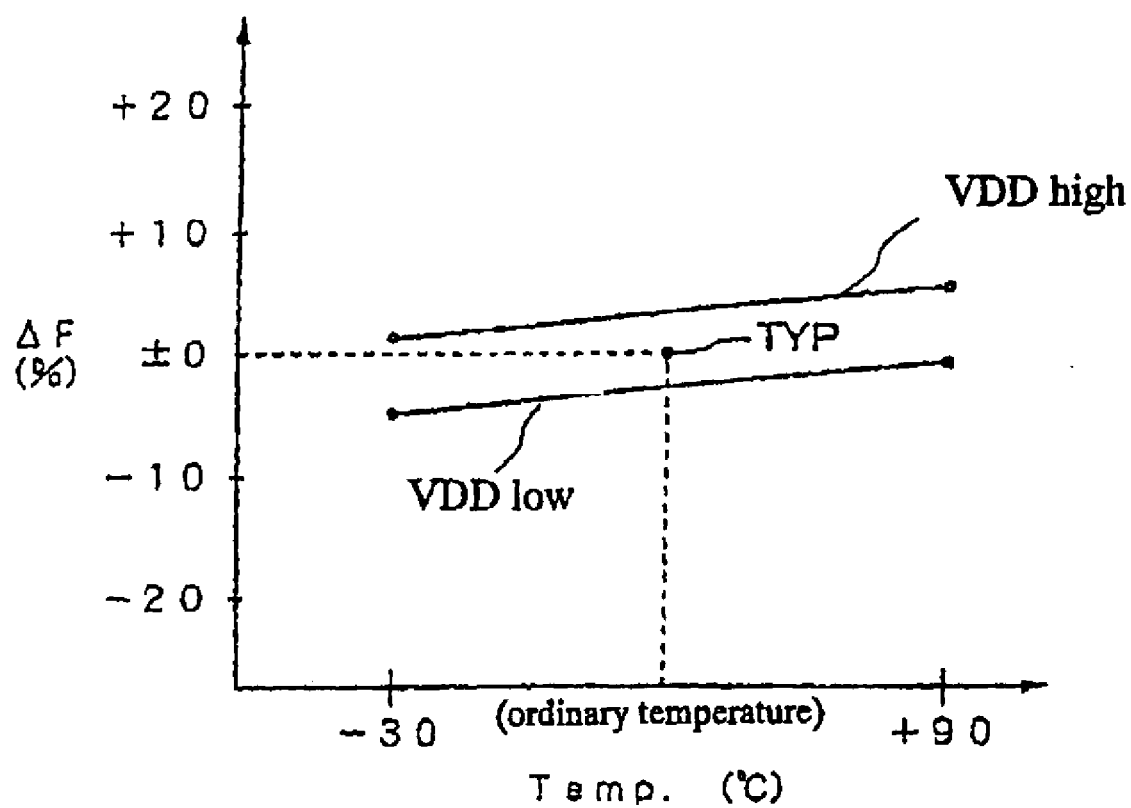
FIG. 2 is a schematic view showing a temperature-dependency of a timer cycle in accordance with the prior art.

Instead of the resistance RR in the conventional circuit configuration shown in FIG. 1, the novel circuit configuration shown in FIG. 4 is provided with a temperature-dependency providing means for providing a temperature dependency to the cycle of the clock signal. The cycle of the clock signal generated by the timer circuit depends upon a current characteristic of the timer circuit, for which reason the temperature-dependency providing means may comprise a circuit for providing a temperature dependency to the current characteristic of the timer circuit. The circuit for providing the temperature dependency to the current characteristic may comprise a series connection of a rectifying device with a temperature-dependent current characteristic and a resistance R. The rectifying device with the temperature-dependent current characteristic may, for example, comprise a diode with the temperature-dependent current characteristic.

In accordance with this embodiment, the rectifying device with the temperature-dependent current characteristic comprises a diode with the temperature-dependent current characteristic, and the temperature-dependency providing means comprises a series connection of a diode D with a temperature-dependent current characteristic and a resistance R.

The timer circuit of the present invention comprises a current mirror circuit, a temperature-dependency providing circuit for providing a temperature dependency to a primary side of the current mirror circuit and for acting as a load to the primary side of the current mirror circuit, a ring oscillator acting as a load to a secondary side of the current mirror circuit, and a buffer circuit B. The temperature-dependency providing circuit for providing the temperature dependency to the primary side of the current mirror circuit and for acting as the load to the primary side of the current mirror circuit comprises a series connection of a diode D as a rectifying device with a temperature-dependent current characteristic and a resistance R.

The current mirror circuit comprises three n-channel MOS transistors N1~N3 and two p-channel MOS transistors P1 and P2. The current mirror circuit controls a secondary current in response to a temperature-dependent primary current flowing through the series connection of the diode D and the resistance R which constitutes the temperature-dependency providing circuit. Namely, the secondary current of the current mirror circuit is also indirectly provided with the temperature dependency.

An input side of the ring oscillator is connected to a secondary side of the current mirror circuit so that the ring oscillator acts as a load to the secondary side of the current mirror circuit. The ring oscillator comprises three inverters I1~I3 connected in ring-shape. Delay capacitors C1~C3 are respectively connected to output sides of the inverters I1~I3. An input side of the buffer circuit B is connected to an output side of the inverter I3 for receiving an input of an oscillation signal outputted from the inverter I3 and outputs a click signal CLK. The cycle of this clock signal CLK will, hereinafter, be referred to as "timer cycle".

An anode of the diode D is connected to a power voltage VDD externally supplied. A cathode of the diode D is connected through the resistance R to a drain of the n-channel MOS transistor N1. A forward-direction barrier potential Vf of the diode D decreases by 2 mV by an temperature increase by 1° C., with increasing a forward-direction current. Namely, the diode D has a positive temperature-dependency. The resistance R performs a load to control appropriately the value of the forward-direction current of the diode D and corresponds to a resistance RR provided in the conventional timer circuit shown in FIG. 1.

As described above, the diode D acts as a rectifying device with the temperature-dependent current characteristic. The temperature-dependency providing circuit comprises this diode D and the resistance R, while the current mirror circuit comprises the n-channel MOS transistors N1~N3 and the p-channel MOS transistors P1~P2. Thus, the temperature-dependency providing circuit and the current mirror circuit constitute a power circuit which generates a power current indirectly provided with a temperature-dependency at a secondary side in response to the primary current with the temperature-dependency.

The inverters I1~I3, the capacitors C1~C3 and the buffer circuit B constitute a clock generating circuit which receives the power current indirectly provided with the temperature-dependency from the power circuit and generates the clock signal CLK.

The above-described circuit configuration is mere one example, but not limited thereto. It is desired that the timer circuit has the following configuration.

The timer circuit in accordance with the present invention comprises a power circuit for generating a power current provided with a temperature-dependency; and a clock generating circuit being connected to an output side of the power circuit for generating a clock signal CLK with a cycle depending upon temperature. The power circuit has such a temperature-dependency that upon temperature increase, the power circuit increases the power current to decrease a clock cycle or a timer cycle, and upon temperature decrease, the power circuit decreases the power current to increase the clock cycle or the timer cycle.

The power circuit may comprise a current mirror circuit; and a temperature-dependency providing circuit being connected to a primary side of the current mirror circuit for supplying a primary current with a temperature-dependency to the current mirror circuit, and the current mirror circuit generates, in its secondary side, a power current provided indirectly with a temperature-dependency in accordance with the primary current with the temperature-dependency.

The temperature-dependency providing circuit may comprise a circuit with a constant temperature-dependency or a constant temperature-dependent characteristic, for example, may comprise a series connection of a rectifying device with a temperature-dependent current characteristic and a resistance.

This rectifying device with the temperature-dependent current characteristic may comprise a series connection of one or plural diodes with the temperature-dependent current characteristic.

The clock generating circuit may comprise a ring oscillator connected to an output side of the power circuit or the secondary side of the current mirror circuit for acting as a load to the secondary side of the current mirror circuit, and a buffer circuit B connected to an output side of the ring oscillator for generating the clock signal CLK with the cycle depending upon temperature.

The circuit configurations of the current mirror circuit, the ring-oscillator and the buffer circuit B are the same as the circuit configuration of the above-described conventional timer circuit shown in FIG. 1. Notwithstanding, one of the subject matters of the present invention is the timer circuit generating the clock signal with the cycle depending upon temperature, and this the circuit configuration will, hereinafter, be described again.

Sources of the n-channel MOS transistors N1~N3 forming the above-described current mirror circuit are commonly grounded. Gates of these n-channel MOS transistors N1~N3 are connected to a drain of the n-channel MOS transistor N1. The drain of the n-channel MOS transistor N1 is connected to another end of the primary side load resistance RR. A drain of the n-channel MOS transistor N3 is connected to each of ground nodes of the inverters I1~I3. Transconductances gm1 and gm2 of the n-channel MOS transistors N1 and N2 are equal to each other. A transconductance gm3 of the n-channel MOS transistor N3 is set at such an appropriate value as providing a ground potential to the inverters I1~I3. In accordance with the conventional circuit configuration, the transconductance gm3 of the n-channel MOS transistor N3 is larger by integer number times than that of the n-channel MOS transistor N1. The n-channel MOS transistors N1 and N3 constitute the current mirror circuit with the primary side load resistance RR which acts as the load to the primary side thereof for supplying the ground potential to the inverters I1~I3.

Sources of the p-channel MOS transistors P1 and P2 are commonly connected to the power. Gates of the p-channel MOS transistors P1 and P2 are connected to a drain of the p-channel MOS transistor P1. A drain of the p-channel MOS transistor P2 is connected to respective power nodes of the inverters I1~I3. A drain of the p-channel MOS transistor P1 is connected to a drain of the above-described n-channel MOS transistor N2. A transconductance gm5 of the p-channel MOS transistor P2 is set at such an appropriate value as providing a ground potential to the inverters I1~I3. A transconductance gm4 of the p-channel MOS transistor P1 is larger by integer number times than that of the p-channel MOS transistor P2. The p-channel MOS transistors P1 and P2 constitute the current mirror circuit with the above-described n-channel MOS transistor N2 which acts as the load to the primary side thereof for supplying the ground potential to the inverters I1~I3.

After operations of the timer circuit shown in FIG. 4 will subsequently be described in details, operations of the semiconductor memory device shown in FIG. 3 and integrating this timer circuit will then be described schematically.

(1) Operation of the Timer Circuit:

In FIG. 4, upon external supply of the power voltage VDD, the primary current flows through the series circuit comprising the diode D, the resistance R and the n-channel MOS transistor N1. If the power voltage VDD is constant, the current flowing through the series circuit is, as described below, definitely decided from a characteristic curve of the forward current of the diode D and a load line of a load circuit comprising the resistance R and the n-channel MOS transistor N1.

Figure 5:
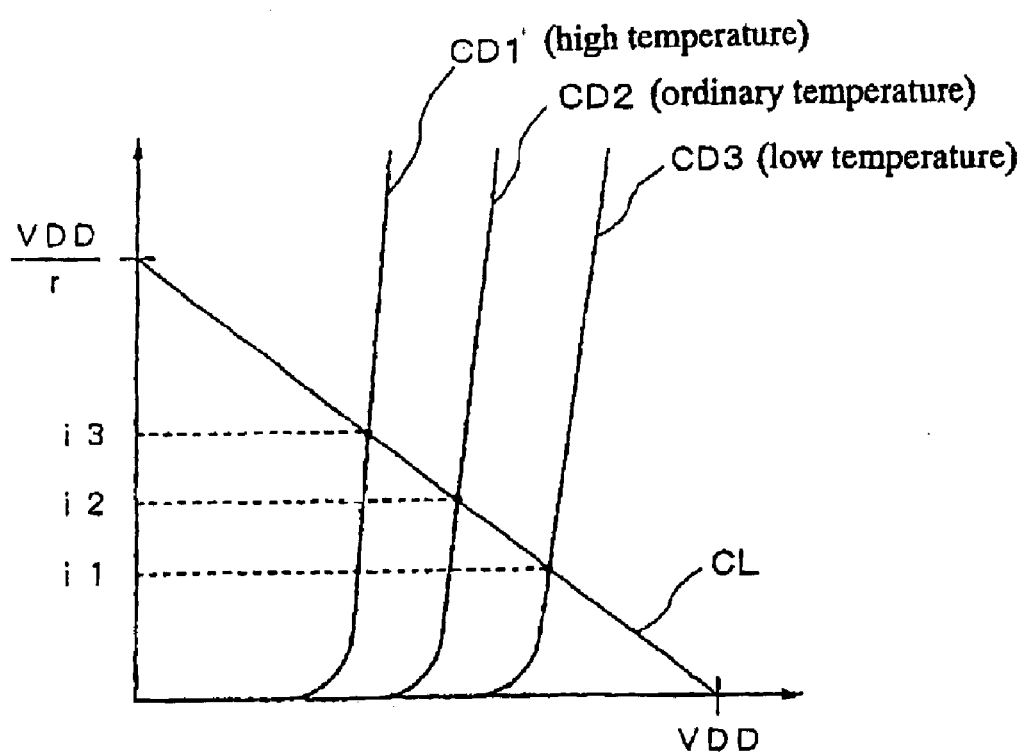
FIG. 5 is a schematic view describing an operational principle of the timer circuit in accordance with the first embodiment of the present invention.

FIG. 5 shows the characteristic curves CD1~CD3 of the diode D and the load line CL of the above-described load circuit. The horizontal axis represents the power voltage VDD, while the vertical axis represents the current flowing through the diode D, the resistance R and the n-channel MOS transistor N1. The characteristic curves CD1~CD3 are of high temperature, ordinary temperature and low temperature respectively, and "r" represents a combined resistance of the resistance R and the n-channel MOS transistor N1. The primary currents flowing through the diode D, the resistance R and the n-channel MOS transistor N1 are found from a crossing points between the characteristic curves CD1~CD3 of the diode D and the load line CL. In the example shown in FIG. 5, a current "i1" is found at a low temperature, and a current "i2" is found at an ordinary temperature, and a current "i3" is found at a high temperature. As the temperature is increased, the current flowing through the diode D or through the above-described primary side series circuit is increased. In accordance with the above, the current flowing through the above-described primary side series circuit is definitely decided depending upon temperature.

Since gates of the n-channel MOS transistors N1~N3 are commonly applied with a voltage appearing at a connection point between the resistance R and the n-channel MOS transistor N1, current ratios of respective currents flowing through the n-channel MOS transistors N1~N3 are decided by transconductances gm of those transistors. In this example, a transconductance gm2 of the n-channel MOS transistor N2 is equal to a transconductance gm1 of the n-channel MOS transistor N1, for which reason a current flowing through the n-channel MOS transistor N2 is almost equal to a current flowing through the n-channel MOS transistor N1. Since a transconductance gm3 of the n-channel MOS transistor N3 is larger by integer number times than a transconductance gm1 of the n-channel MOS transistor N1, a current flowing through the n-channel MOS transistor N3 is larger by integer number times than a current flowing through the n-channel MOS transistor N1.

The n-channel MOS transistor P1 and the n-channel MOS transistor N2 are connected in series, for which reason the current flowing through the n-channel MOS transistor P1 is equal to the current flowing through the n-channel MOS transistor N2. Accordingly, the current flowing through the n-channel MOS transistor P1 is equal to the current flowing through the n-channel MOS transistor N1. Since a transconductance gm2 of the p-channel MOS transistor P2 is larger by integer number times than a transconductance gm1 of the p-channel MOS transistor P1, a current flowing through the p-channel MOS transistor P2 is larger by integer number times than a current flowing through the p-channel MOS transistor P1 or than the current flowing through the n-channel MOS transistor N1. Those currents flowing through the p-channel MOS transistor P2 and the n-channel MOS transistor N3 are driving currents for the inverters I1~I3.

The ring oscillator comprising the inverters I1~I3 are driven by the power current which is supplied through the p-channel MOS transistor P2 and the n-channel MOS transistor N3. The oscillation signal (no sign) is outputted from the inverter I3 on the final stage. In this oscillation process, each inverters drive the capacitors C1~C3 connected to those output sides and output signals to the follower state inverters respectively. The buffer circuit B receives the oscillation signal outputted from the inverter I3 and outputs the clock signal CLK. The cycle of the clock signal CLK will, hereinafter, be referred to as "timer cycle".

The oscillation cycle (timer cycle) of the ring oscillator comprising the inverters I1~I3 is decided by a charge-discharge time for charging and discharging each of the capacitors C1~C3 when each inverter outputs the signal to the follower inverter. The charge-discharge time depends upon a driving current of each inverter. As this driving current is large, the charge-discharge time of the capacitor is short and the oscillation cycle of the ring oscillator is short. In this timer circuit, the inverters I1~I3 are supplied with the driving current flowing through the p-channel MOS transistor P2 and the n-channel MOS transistor N3, for which reason the charge-discharge times of the capacitors C1~C3 are controlled by controlling the current flowing through those transistors to control the timer cycle.

As described above, the current flowing through the p-channel MOS transistor P2 and the n-channel MOS transistor N3 is larger by integer number times than the current flowing through the n-channel MOS transistor N1. This current flowing through the n-channel MOS transistor N1 is subjected to an influence of the temperature-characteristic, and thus the timer cycle reflects the temperature characteristic of the diode D. Concretely, as the temperature increases, the current flowing through the diode increases (the current flowing through the n-channel MOS transistor N1 increases) whereby the current supplied through the p-channel MOS transistor P2 and the n-channel MOS transistor N3 to the inverters I1~I3 increases. As a result, the oscillation cycle of the ring oscillator becomes short and the timer cycle becomes short. As the temperature becomes low, the current flowing through the diode D becomes decreased and the timer cycle becomes low.

Subsequently, a method of setting the timer cycle of the above-described time circuit will be described.

Figure 6:
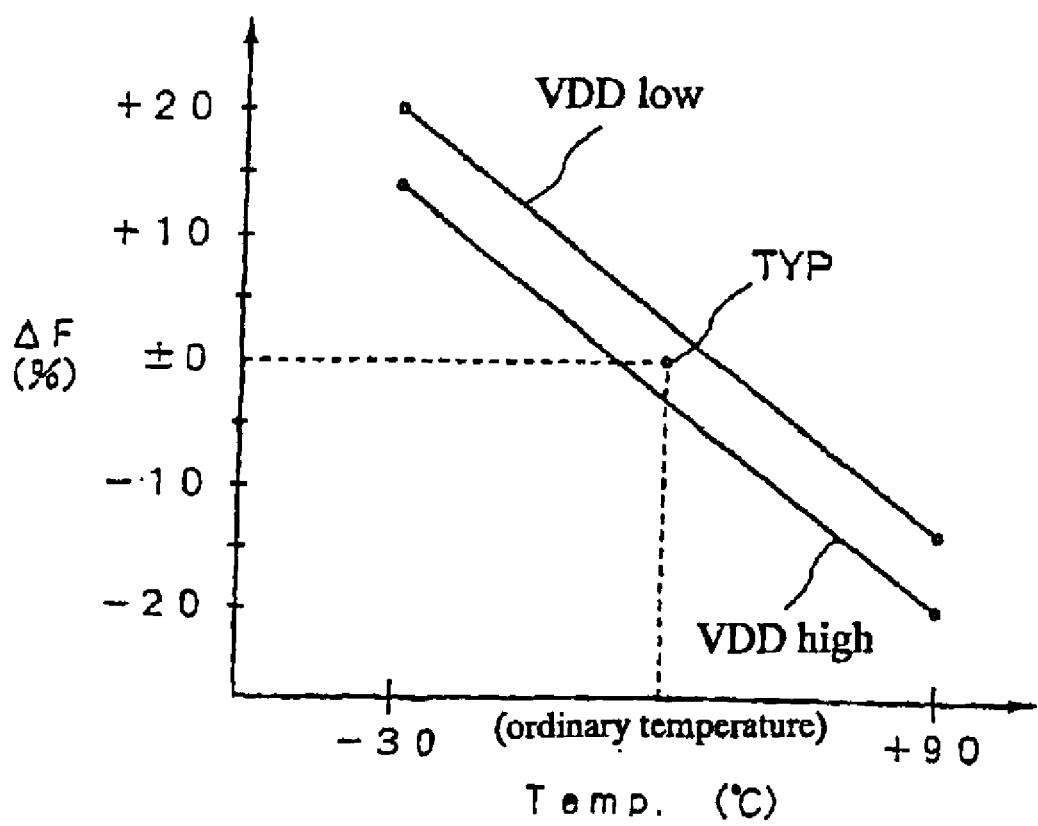
FIG. 6 is a schematic view showing a temperature-dependency of the timer cycle in accordance with the first embodiment of the present invention.

FIG. 6 shows a temperature-characteristic of the timer cycle of the clock signal CLK generated by the timer circuit in accordance with this embodiment. As described above, the timer cycle generated by this timer circuit tends to be decreased upon temperature increase, for which reason at a high temperature, the time interval of the refresh is short. A data hold characteristic by the memory cell becomes strict as the temperature becomes high. For this reason, for setting the timer cycle of the clock signal generated by the timer circuit, the timer cycle is so set by adjusting the oscillation cycle of the ring oscillator comprising the inverters I1~I3 by adjusting circuit constants of the inverters I1~I3 and the capacitance values of the capacitors C1~C3, so as to obtain the necessary refresh time interval even under the worst temperature condition for example high temperature condition, so that the refresh operation is ensured over the full operational temperature range. The temperature-dependency of the timing of the clock signal is inter-related to the data holding characteristic of the memory cells of the semiconductor memory device.

The data holding characteristic of the memory cell tends to depend upon the power voltage. The timer circuit in accordance with the embodiment 1 tends to depend upon the power voltage. It is, therefore, possible that the timer circuit has a function to adjust the timer cycle in response to the power voltage dependency of the data holding characteristic of the memory cell. This function will, however, be described in embodiment 6.

As described above, for self-refresh, the refresh time interval is decided based on the timer cycle of the clock signal CLK outputted from the timer circuit for automatic refresh operation internally. In accordance with this timer circuit, the power current to be supplied to the inverters I1~I3 is controlled in response to the temperature-dependency of the diode D, so as to control the timer cycle depending upon temperature. Accordingly, the timer cycle is decreased under the high temperature worst condition, while the timer cycle is increased under the ordinary or low temperature. The timer cycle is adjust in response to the temperature-dependency of the data holding characteristic of the memory cell.

(2) Whole Operations of the Semiconductor Memory Device:

Operations of the semiconductor memory device integrating the above-described timer circuit will subsequently be described.

In case of no external access (no address transition), the semiconductor memory device holds data in the memory cells with periodic self-refresh operations. This self-refresh operation is made under the control of the refresh control circuit 4 with a time interval based on the cycle of the clock signal CLK outputted from the above-described timer circuit or the timer cycle. If the temperature becomes increased, as described above, the timer cycle becomes changed depending upon the temperature characteristic of the diode D, whereby the time interval of the refresh operation is adjusted depending upon temperature, so that the self-refresh is made at an optimum time interval depending upon temperature.

In case of any external access, for example, an appearance of any address transition, the semiconductor memory device performs another refresh in the same cycle as the read/write operation differently from the above-described self-refresh. The refresh in this operational mode is made by detecting the address transition and which is separately made from the above-described self-refresh defined by the timer cycle. Accordingly, there is no directional relationship to the operation of the above-described timer circuit in accordance with the present invention.

For additional informations, operations upon an external access will be described.

If, at a time, the address signal ADD is changed, this address is taken into the address input system 1 and then the latch address LADD is outputted. An address transition detecting circuit (not illustrated) which constitutes the pulse generator 3 detects the transition of the address LADD and outputs the address transition detection signal φ ATD. The address multiplexer 5 receives the address transition detection signal φ ATD and selects the refresh address RADD as the address MADD0. A word line designated by the address MADD (the refresh address RADD) is driven and a series of the refresh operations is made at a predetermined timing as from a rising edge of the address transition detection signal φ ATD.

Thereafter, the address multiplexer 5 selects the lath address LADD0 as the address MADD0. A latch control signal LC is activated at a predetermined timing as from a falling edge of the address transition detection signal φ ATD. A latch 103 latches the present value of the address ADD based on the latch control signal LC. A word line designated by the address MADD (the latch address LADD) is driven and a series of the read/write operation is made at a predetermined timing as from a rising edge of the latch control signal LC. In accordance with this semiconductor memory device, if the address transition appears, separately from the self-refresh, the refresh operation is made in the same cycle as the read/write operation in response to the appearance of the address transition.

Embodiment 2

An embodiment 2 of the present invention will subsequently be described.

In the above-describe embodiment 1, the gradient of the temperature characteristic of the timer cycle shown in FIG. 6 or the temperature dependency is definitely decided. Whereas the circuit constants of the inverters I1~I3 and the capacitance values of the capacitors C1~C3 are decided so as to ensure the refresh operation at the high temperature condition, it is not ensured that the refresh time interval under the ordinary or low temperature conditions is appropriately set. In order to set appropriately the refresh time interval over the full temperature range, a further function for changing or varying the gradient of the characteristic line of the timer cycle is desired.

A timer circuit in accordance with this embodiment 2 is based on this viewpoints and comprises a power circuit for generating a power current provided with a temperature-dependency and a clock generating circuit connected to an output side of this power circuit for generating a clock signal CLK with a cycle depending upon temperature. The power circuit has such a temperature dependency that upon temperature increase, the power circuit increases the power current to decrease a clock cycle or a timer cycle, and upon temperature decrease, the power circuit decreases the power current to increase the clock cycle or the timer cycle.

The power circuit comprises a current mirror circuit; and a temperature-dependency providing circuit being connected to a primary side of the current mirror circuit for supplying a primary current with a temperature-dependency to the current mirror circuit, and the current mirror circuit generates, in its secondary side, a power current provided indirectly with a temperature-dependency in accordance with the primary current with the temperature-dependency.

The temperature-dependency providing circuit may comprise a circuit with a variable temperature-dependency or a variable temperature-dependent characteristic. The temperature-dependency providing circuit is configured to control the temperature-dependency or temperature-characteristic. The temperature-dependency providing circuit is added with a function to change or vary the gradient of the temperature characteristic line of the timer cycle. Thus, the temperature-dependency providing circuit may comprise a temperature-dependency varying circuit. Whereas the timer cycle is set with a priority to ensure the refresh operation at high temperature, it is possible to obtain appropriate refresh time intervals at ordinary or low temperatures.

A circuit configuration of the temperature-dependency varying circuit should not be limited, provided that the circuit has a function to vary the temperature-dependency. Intone example of the circuit configuration, it is possible that the number of diodes D acting as rectifying devices is variable, while the plural diodes are connected in series in the primary side of the current mirror circuit. A circuit configuration for varying the number of the diodes D should not be limited, provided that there is a function therefor. In one example, it is possible that a switching device is connected in parallel to each diode D, so that a current path of the primary current of the current mirror circuit is variable, thereby to vary the number of the diodes D on the current path.

The clock generating circuit may comprises the same circuit configuration as in the embodiment 1. Namely, the clock generating circuit may comprise a ring oscillator connected to the output side of the power circuit or the secondary side of the current mirror circuit for acting as the load to the secondary side of the current mirror circuit, and a buffer circuit connected to the output side of the ring oscillator for generating the clock signal CLK with the temperature-dependent cycle.

Figure 7:
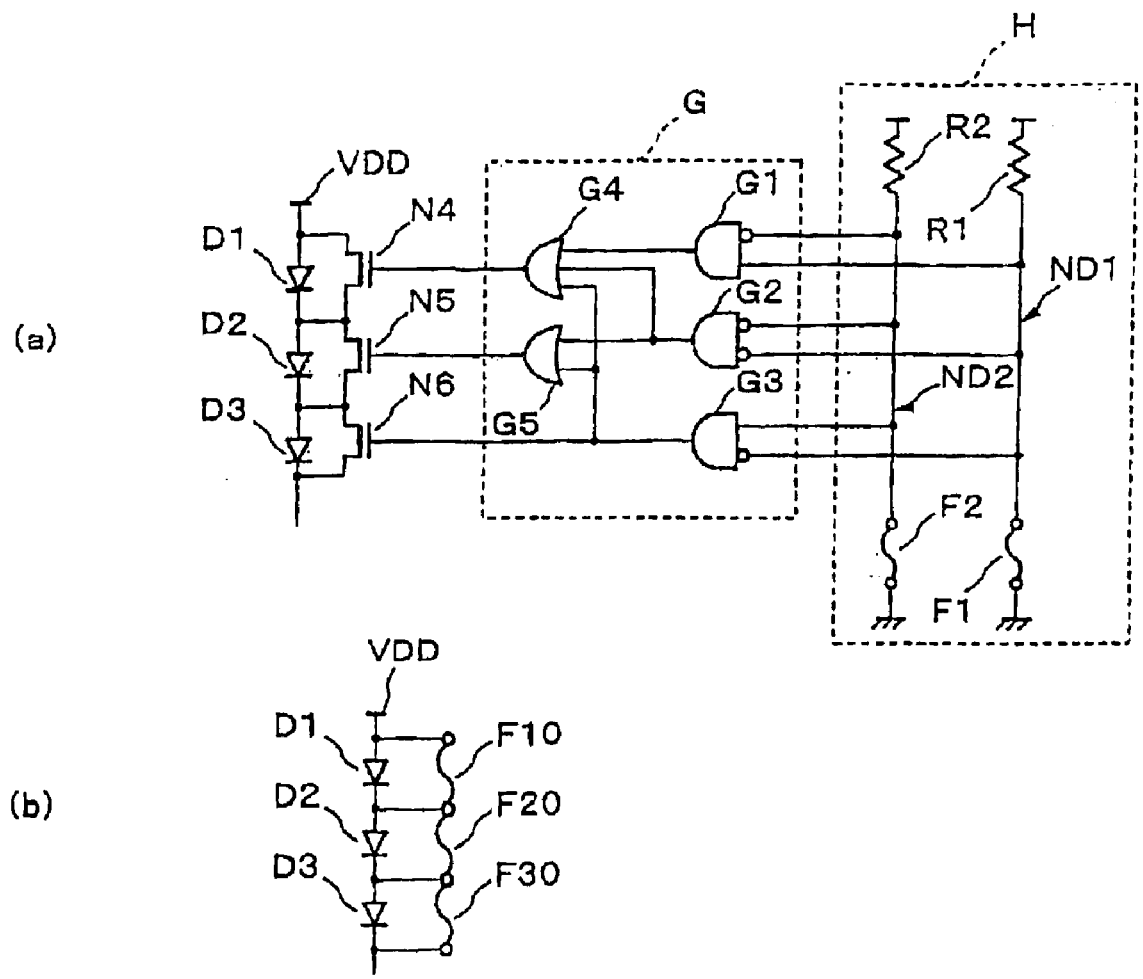
FIG. 7 is a circuit diagram of a by-pass circuit of a diode in accordance with a second embodiment of the present invention.

One example of the circuit configuration of the timer circuit in accordance with this embodiment 2 will be shown. Instead of the diode D shown in FIG. 4 in the embodiment 1, a temperature characteristic varying circuit shown in FIG. 7(a) is provided. This temperature characteristic varying circuit comprises a fuse circuit H, a gate circuit G, n-channel MOS transistors N4~N6 and diodes D1~D3. The fuse circuit H comprises a series connection of a resistance R1 and a fuse F1 between the power VDD and the ground, and another series connection of a resistance R2 and a fuse F2 between the power VDD and the ground.

The gate circuit G comprises logic AND-gates G1 and G3 with inputs of negative logic and positive logic and a logic AND-gate G2 with inputs of negative logic only, and logic OR-gates G4 and G5. The negative logic input of the logic AND-gate G1 is connected to a connection node ND2 between the resistance R2 and the fuse F2. The positive logic input of the logic AND-gate G1 is connected to another connection node ND1 between the resistance R1 and the fuse F1. The negative logic inputs of the logic AND-gate G2 are connected to the connection nodes ND1 and ND2 respectively. The positive logic input of the logic AND-gate G3 is connected to the connection node ND2. The negative logic input of the logic AND-gate G3 is connected to the connection node ND1. Inputs of the logic OR-gate G4 are connected to outputs of the above-described logic AND-gates G1~G3. Inputs of the logic OR-gate G5 are connected to outputs of the above-described logic AND-gates G2 and G3. Output signals from the logic OR-gates G4 and G5 are output signals of the gate circuit G.

The diodes D1~D3 are connected in series between the power VDD and the resistance R shown in FIG. 4. Namely, an anode of the diode D1 is connected to the power VDD. An anode of the diode D2 is connected to a cathode of the diode D1. An anode of the diode D3 is connected to a cathode of the diode D2. A cathode of the diode D3 is connected to one end of the resistance R. The n-channel MOS transistors N4~N6 are connected in parallel to the diodes D1~D3 to form parallel current paths. Gates of the n-channel MOS transistors N4~N6 are respectively connected to outputs of the logic OR-gate G4, the logic OR-gate G5 and the logic AND-gate G3 in the above-described gate circuit. The n-channel MOS transistors N4~N6 provide by-paths to the diodes D1~D3.

Operations of the temperature-characteristic varying circuit will subsequently be described.

In accordance with this temperature-characteristic varying circuit, the fuses F1 and F2 are selectively cut off to provide respective by-paths, so that the number of the effectively connected diodes is changed or varied. Concretely, if the fuses F1 and F2 are not cut out, the ground potential appears at the connection nodes ND1 and ND2 through the fuses F1 and F2. In this case, in the logic AND-gates G1~G3, only the logic gate G2 outputs the high level signal "H". As a result, the n-channel MOS transistors N4 and N5 receiving the output signals from the logic OR-gates G4 and G5 are made into conductive state. Thus, the diodes D1 and D2 are by-passed so that the effective diode is only one. Namely, only the diode D3 acts as a rectifying device.

If the fuse F1 only is cut out, then the potential of the power VDD appears at the connection node ND1 through the resistances R1 and R2, while the ground potential appears at the connection node ND2 through the fuse F2. In this case, in the logic AND-gates G1~G3, only the logic gate G1 outputs the high level signal "H". As a result, only the n-channel MOS transistor N4 receiving the output signal from the logic OR-gate G4 is made into conductive state. Thus, the diode D1 is by-passed so that the effective diode is two. Namely, the diodes D2 and D3 act as rectifying device.

If the fuse F2 only is cut out, then the potential of the power VDD appears at the connection node ND2 through the resistance R2, while the ground potential appears at the connection node ND1 through the fuse F1. In this case, in the logic AND-gates G1~G3, only the logic gate G3 outputs the high level signal "H". As a result, the n-channel MOS transistors N4 and N5 receiving the output signals from the logic OR-gates G4 and G5 and the n-channel MOS transistor N6 receiving the output signal from the logic OR-gate G3 are made into conductive state. Thus, the diodes D1~D3 are by-passed so that the effective diode is zero. Namely, the diodes D1~D3 do not act as rectifying device.

If the fuses F1 and F2 are cut out, then the potential of the power VDD appears at the connection nodes ND1 and ND2 through the resistances R1 and R2. In this case, output signals from the logic AND-gates G1~G3 are low level. As a result, the n-channel MOS transistors N4, N5 and N6 are not made into conductive state. Thus, the number of the effective diode is three. Namely, all the diodes D1~D3 act as rectifying device.

Selective cutting the fuses F1 and F2 may vary, from zero to three, the number of the acting diodes.

In accordance with the temperature-characteristic varying circuit shown in FIG. 7(a), in an initial state where all fuses are not yet cut, the number of the acting diode is 1. By selectively cutting the fuses, it is possible to make the number of the acting diodes into 0, 2 or 3. The number of the acting diodes may be varied from 1. Accordingly, it is possible to respond to both cases of the long and short refresh timing intervals.

Whereas, in this example, three diodes D1~D3 are provided and selectively by-passed, the number of the provided diodes is optional. For example, five diodes may be connected in series and selectively by-passed. In the state of no cut of the fuses, the number f the diodes provided may also be optional.

In the above-described example shown in FIG. 7(a), it is possible to increase and decrease the number of the diodes as provided. If only increasing the number of the diodes provided is needed, then another example shown in FIG. 7(b) may be available. Three fuses F10~F30 providing by-passes to the diodes D1~D3 may be connected in parallel to the diodes D1~D3 respectively. In this case, if, however, the number of the acting diodes in the initial state should be 1, then only the fuses F20 and F30 are provided, while the fuse F10 is not provided.

In this example, the number of the diodes connected in parallel to the cut fuses is the number of the acting diodes. For example, if the fuse F10 only is cut, the number of the acting diode is 1 (diode D1). If the fuses F10 and F20 are cut, then the number of the acting diode is 2 (diodes D1 and D2). In this example, three diodes are provided. It is, however, necessary to limit the number. The necessary sets of the diodes and the fuses may optionally be provided.

A relationship between the number of the acting diodes and the gradient of the temperature characteristic of the timer cycle will subsequently be described. As described above, if temperature is varied by 1° C., then the barrier potential Vf of the diode is varied by 2 mV. If two diodes are connected in series, then a temperature variation by 1° C. causes a variation by 4 mV of the effective barrier potential Vf. Namely, the variation rate of the barrier potential Vf by temperature variation of 1° C. may be selected by selecting the number of the diodes connected in series. The variation of the barrier potential Vf cases the current flowing through the diodes. As the number of the connected diodes is increased, the variation rate of the forward current by temperature variation of 1° C. tends to be increased. Accordingly, selectively cutting the fuses F1 and F2 for selecting the number of the connected diodes causes the variation in the gradient of the characteristic line of the timer cycle shown in FIG. 6.

As described above, in accordance with this embodiment 2, the number of the acting diodes connected in the primary side of the current mirror circuit may be changed or varied to vary or change the gradient of the temperature characteristic of the timer cycle. Thus, it is possible to set appropriately the refresh timing interval at the ordinary and low temperatures with ensuring the refresh operation at the high temperature.

Embodiment 3

The embodiment 2 of the present invention will be described.

A timer circuit in accordance with the embodiment 3 is modified from the basic configuration of the timer circuit in accordance with the above-described embodiment 1, so that the timer cycle is switched between in the stand-by state and in the active state.

Prior to description of the embodiment 3, the significance of switching the timer cycle between in the stand-by state and in the active state will be described.

As in the semiconductor memory device described in the embodiment 1, if in the active state, the refresh operation is made in the same cycle as the read/write operation, then the refresh operation may provide any interference to the subsequent read/write operation, whereby an operational margin may be deteriorated.

Figure 8:
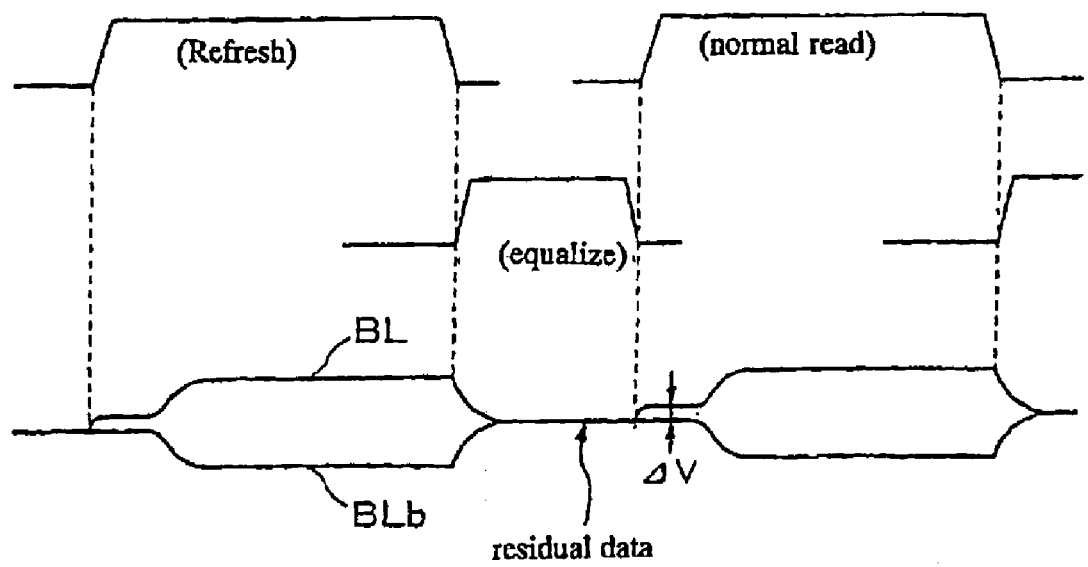
FIG. 8 is a timing chart describing a significance of a timer circuit in accordance with a third embodiment of the present invention.

For example, in FIG. 8, if after refresh operation, equalizing data signals BL and BLb on bit lines is insufficient, the existent data reside on the bit line, whereby an off-set potential is generated on the bit line. In this case, if a time passes after a memory cell, which is subject to a next read, is last-refreshed and this memory cell becomes close to a hold limit, a voltage level representing data in this memory cell is deteriorated. If the data is read out from this memory cell, then a residual data interferes to the read out data, whereby an amplitude Δ V of the data signal on the bit line is small, resulting in decrease of the operational margin.

In order to avoid the decrease of the operational margin, it is effective to avoid the deterioration of the voltage level which represents the data in the memory cell, and thus to shorten the refresh time interval. In contrast to this, in the stand-by state, such interference is absent, and this it is unnecessary to shorten the refresh time interval.

Accordingly, the timer circuit in accordance with this embodiment 3 is configured in this viewpoint so that the timer cycle for providing the refresh time interval is switched between the stand-by state and the active state. Namely, in the active state, the timer cycle is shorter than that in the stand-by state and the refresh time interval is also shorter in the active state.

A timer circuit in accordance with this embodiment 3 is based on this viewpoints and comprises a power circuit for generating a power current provided with a temperature-dependency and a clock generating circuit connected to an output side of this power circuit for generating a clock signal CLK with a cycle depending upon temperature. The power circuit has such a temperature dependency that upon temperature increase, the power circuit increases the power current to decrease a clock cycle or a timer cycle, and upon temperature decrease, the power circuit decreases the power current to increase the clock cycle or the timer cycle.

The power circuit comprises a current mirror circuit; and a temperature-dependency providing circuit being connected to a primary side of the current mirror circuit for supplying a primary current with a temperature-dependency to the current mirror circuit, and the current mirror circuit generates, in its secondary side, a power current provided indirectly with a temperature-dependency in accordance with the primary current with the temperature-dependency.

The temperature-dependency providing circuit may comprise a circuit with a constant temperature-dependency or a constant temperature-dependent characteristic and also with a function of varying a current independent from temperature. The temperature-dependency providing circuit varies the current value depending upon temperature and in addition is configured to control the current value based on the control signal, so as to vary the current value depending upon not only temperature but also other factors, for example, active state and stand-by state of the device, thereby varying the timer cycle and varying the refresh time interval. Concretely, in the active state, the timer cycle is shorter than that in the stand-by state, to order to shorten the refresh time interval in the active state as compared to the stand-by state.

The temperature-dependency providing circuit should not be limited in its circuit configuration, provided that the circuit has the above functions. One example of the circuit configuration may comprise a series connection of a rectifying device with a temperature-dependent current characteristic and a variable resistance circuit varying its resistance value based on the control signal. This variable resistance circuit should not be limited in its circuit configuration, provided that the circuit has a function of varying its resistance value based on the control signal. One example of the circuit configuration may comprise a series connection of plural resistances and a by-pass providing circuit element for selectively forming a by-pass to at least one resistance. This by-pass path providing circuit element should not be limited in its element type, provided the element has a function of selectively forming the by-pass to the resistance based on the control signal. One example of the by-pass path providing circuit element may comprise a switching transistor connected in parallel to the resistance.

The rectifying device with the temperature-dependent current characteristic may comprise a series connection of one or more diodes D showing temperature-dependent current characteristic.

The clock generating circuit may has the same circuit configuration as in the embodiment 1. Namely, the clock generating circuit may comprise a ring oscillator connected to an output side of the power circuit or a secondary side of the current mirror circuit for acting as a load to the secondary side of the current mirror circuit, and a buffer circuit B connected to an output side of the ring oscillator for generating a clock signal CLK with a temperature-dependent cycle.

Figure 9:
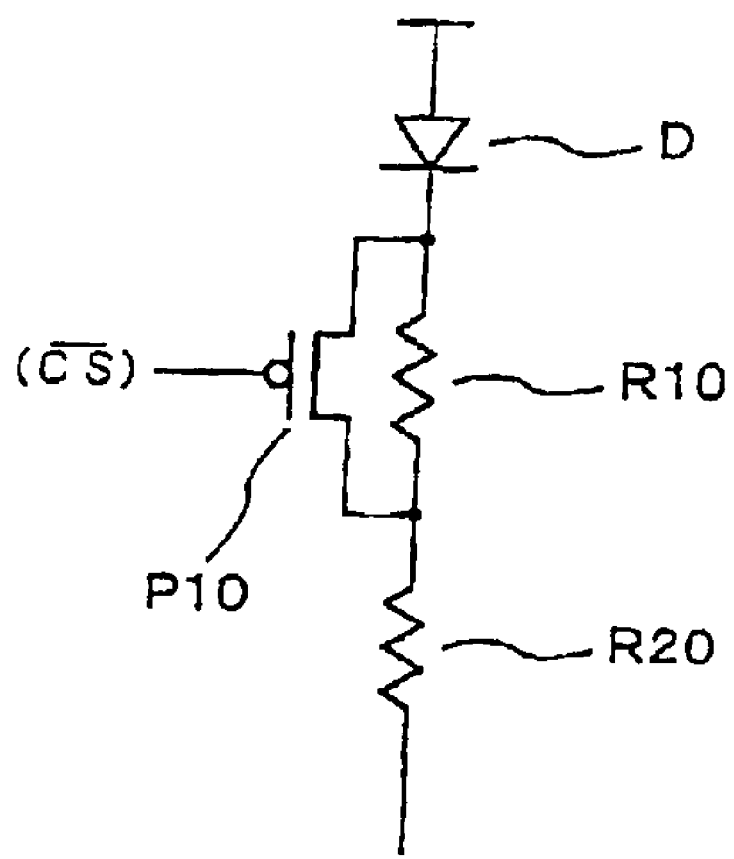
FIG. 9 is a diagram showing a characteristic part of the timer circuit in accordance with the third embodiment of the present invention.

One example of the timer circuit in accordance with this embodiment 3 will be described with reference to FIG. 9. Instead of the resistance R shown in FIG. 4 in the embodiment 1, resistances R10 and R20 and a p-channel MOS transistor P10 are provided as shown in FIG. 9. The resistances R10 and R20 are connected in series between a cathode side of the diode D and a drain of the n-channel MOS transistor N1 shown in FIG. 4, and a current path of the p-channel MOS transistor P10 is connected in parallel to the resistance R10. A gate of the p-channel MOS transistor P10 is supplied with a signal derived from a chip select signal /CS externally entered. A resistance value of the resistance R20 is set equal to a resistance value of the resistance shown in FIG. 4.

In this embodiment, if the chip select signal/CS is low level "L" or the device is in the active state, then the p-channel MOS transistor P10 is made into conductive state, whereby the resistance R10 is by-passed. The resistance R20 with the same resistance value as the resistance R shown in FIG. 4 is present between the diode D and the n-channel MOS transistor N1. Thus, the circuit is made equivalent to the timer circuit shown in FIG. 4 and the timer cycle of this circuit is made equal to that of the timer circuit shown in FIG. 4.

If the chip select signal/CS is high level "H" or the device is in the inactive state, then the p-channel MOS transistor P10 is made into nonconductive state, whereby not only the resistance R20 but also the resistance R10 are present between the diode D and the n-channel MOS transistor N1. Thus, the current flowing through the n-channel MOS transistor N1 is controlled, whereby the power current supplied to the inverters I1~I3 is controlled, thereby increasing the timer cycle.

In the manner as described above, the timer cycle is appropriately switched between in the stand-by state and in the active state.

In this embodiment 3, in the active state, the refresh time interval may be shortened to avoid a considerable interference of data, and in the stand-by state, the refresh time interval is increased to suppress the current comsumption for the refresh operation.

Embodiment 4

The embodiment 4 of the present invention will subsequently be described.

A timer circuit of this embodiment 4 is integrated in the semiconductor memory device and is configured to achieve the same objects as the timer circuit in accordance with the above-described embodiment 3. The timer circuit has a function of switching the timer cycle between in the stand-by state and in the active state.

The timer circuit in accordance with the present invention may comprise a timer circuit outputting a first clock signal, a clock signal cycle varying circuit connected to this timer circuit for varying a cycle of the first clock signal and outputting a second clock signal with a different cycle from the first clock cycle, and a selecting circuit connected to the timer circuit and the clock signal cycle varying circuit for selecting one of the first and second clock signals and outputting the selected one.

The timer circuit outputting the first clock signal may comprise one of the timer circuits in the foregoing embodiments 1–3 or a know timer circuit, for example, the conventional timer circuit shown in FIG. 1.

The above-described clock signal cycle varying circuit should not be limited in its circuit type or circuit configuration, provided that the circuit has a function of varying the cycle of the first clock signal. One example of the clock signal cycle varying circuit may comprise a binary counter which divides the cycle or frequency of the first clock signal. The binary counter divides the cycle of the first clock signal and outputs the second clock signal with the different cycle from the first clock signal.

The selecting circuit should not be limited in its circuit type or circuit configuration, provided that the selecting circuit selects one of the first and second clock signals based on a control signal and outputs the selected one. One example of the selecting circuit may comprise a multiplexer. The multiplexer selects one of the first clock signal from the timer circuit and the second clock signal from the clock signal cycle varying circuit based on the control signal and outputs the selected one.

For example, if the device is in the stand-by state, the selecting circuit selects and outputs the second clock signal. If the device is in the active state, the selecting circuit selects and outputs the first clock signal. As a result, in the active state, the refresh time interval is shortened to avoid the considerable interference of data. In the stand-by state, the refresh time interval is increased to suppress the current comsumption for the refresh operation.

Figure 10:
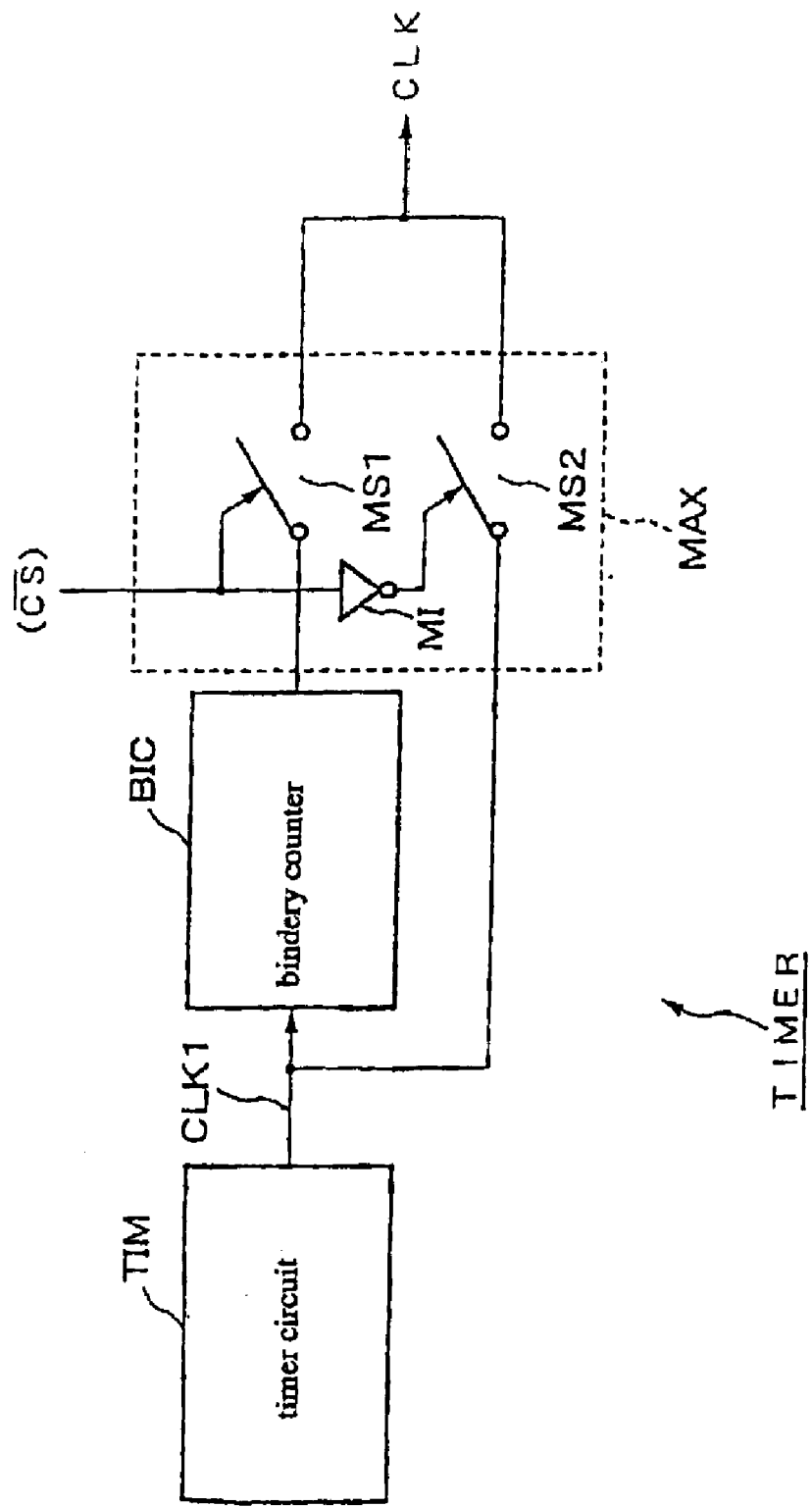
FIG. 10 is a circuit diagram showing a configuration of a timer circuit in accordance with a fourth embodiment of the present invention.

FIG. 10 shows one example of the circuit configuration of the timer circuit TIMER in accordance with the embodiment 4. This timer circuit TIMER comprises the timer circuit of one of the above-described embodiments 1–3 and a binary counter BIC and a multiplexer MUX on the follower stage of the timer circuit. In this figure, the timer circuit TIMER has the same circuit configuration as the timer circuit of one of the above-described embodiments 1–3. The timer circuit TIM outputs a clock signal CLK1. As this timer circuit TIM, the conventional timer circuit shown in FIG. 1 may be used. The binary counter BIC receives an input of the clock signal CLK1 from the timer circuit TIM and divides the cycle of this clock signal or divides the timer cycle into the natural number times.

The multiplexer MUX selects one of the clock signals outputted from the timer circuit TIM and the binary counter BIC based on the chip select signal/CS, and outputs the selected one as the clock signal CLK. This multiplexer MUX comprises an inverter MI which inverts the control signal derived from the chip select signal/CS, and switches MS1 and MS2 controlled into ON-state complementary in accordance with this control signal.

An input port of the switch MS1 is connected to an output port of the binary counter BIC. An input port of the switch MS2 is connected to an output port of the timer circuit TIM. Output ports of the switches MS1 and MS2 are commonly used as the output of the timer circuit TIMER.

In accordance with the timer circuit of the embodiment 4, the timer circuit TIM operates similarly to that in the embodiments 1–3, and outputs the clock signal CLK. The binary counter BIC divides the clock signal CLK and outputs the clock signal with the cycle shorter by the natural number times. If the semiconductor memory device integrating this timer circuit is controlled into the active state by the externally supplied chip select signal/CS, then the switch MS2 of the multiplexer MAX is made into the ON-state, whereby the clock signal CLK1 outputted from the timer circuit TIM is outputted as the clock signal CLK.

If the semiconductor memory device is controlled into the standby state by the chip select signal/CS, then the switch MS1 of the multiplexer MAX is made into the ON-state, whereby the clock signal CLK2 outputted from the binary counter BIC is outputted as the clock signal CLK. In the active state the timer cycle or the cycle of the clock signal CLK is the cycle of the clock signal CLK1 generated by the timer circuit TIM, and in the stand-by state, the timer cycle is made longer by the natural number times than that-in the active state.

In accordance with the timer circuit of the embodiment 4, similarly to the embodiment 3, in the active state, the refresh time interval is shortened to avoid the considerable interference of data, and in the stand-by state, the refresh time interval is increased to suppress the current comsumption for the refresh operation.

Embodiment 5

The embodiment 5 of the present invention will subsequently be described.

The embodiment 5 is to apply the basic concept of the timer circuit in accordance with the present invention into the pulse generating circuit having a function of varying a pulse width. As one example, the pulse generating circuit is applicable to a word pulse generating circuit of the semiconductor memory device. In this case, the word pulse generating circuit constitutes a row control circuit 13 shown in FIG. 3. Thus, the word pulse generating circuit receives the address transition detection signal φATD outputted from the pulse generator 3 and generates a word pulse for driving the word line. This word pulse reflects the row enable signal RE. The timer circuit for timing the self-refresh time interval comprises that in either one of the above-described embodiments 1–4. The refresh control is so made that the refresh time interval is made shorter upon temperature increase.

In general, widening the word pulse improves the write level of the memory cell and improves the data holding characteristic. In accordance with the embodiments 1–3, the refresh time interval is appropriately controlled depending upon temperature. In case of high temperature or in the active state, the refresh time interval is short. In case of the low temperature or the stand-by state, the refresh time interval is increased. Attracting a relationship between the refresh time interval and the word pulse width, if the refresh time interval is short, then the word pulse width may be short, and if the refresh time interval is long, then the word pulse width is preferably long.

The semiconductor memory device in accordance with this embodiment 5 is based on this viewpoint and is so configured that the pulse width is switched based on the temperature and the operating state, for example, the active state or the stand-by state.

In accordance with the present invention, the pulse generating circuit with the function of varying the pule width comprises a power circuit for generating a power current provided with a temperature-dependency; and a clock generating circuit being connected to an output side of the power circuit for generating a pulse signal with a cycle depending upon temperature from the power current. The power current has the temperature-dependency such that upon temperature increase, the power circuit increases the power current to decrease a pulse cycle, and upon temperature decrease, the power circuit decreases the power current to increase the pulse cycle.

The power circuit may comprise a current mirror circuit; and a temperature-dependency providing circuit being connected to a primary side of the current mirror circuit for supplying a primary current with a temperature-dependency to the current mirror circuit, and the current mirror circuit generates, in its secondary side, a power current provided with a temperature-dependency in accordance with the primary current with the temperature-dependency.

This temperature-dependency providing circuit may comprise a circuit with a constant temperature-dependency or a constant temperature-dependent characteristic, for example, may comprise a series connection of a rectifying device with a temperature-dependent current characteristic and a resistance R.

This rectifying device with the temperature-dependent current characteristic may comprise a series connection of one or plural diodes D with the temperature-dependent current characteristic.

The clock generating circuit may comprise a ring oscillator connected to an output side of the power circuit or the secondary side of the current mirror circuit for acting as a load to the secondary side of the current mirror circuit, and a buffer circuit B connected to an output side of the ring oscillator for generating the clock signal CLK with the cycle depending upon temperature.

Instead of the circuit with a constant temperature-dependency or a constant temperature-dependent characteristic, the temperature-dependency providing circuit may alternatively comprise a circuit with a variable temperature-dependency or a variable temperature-dependent characteristic. The temperature-dependency providing circuit is configured to control the temperature-dependency or temperature-characteristic. The temperature-dependency providing circuit is added with a function to change or vary the gradient of the temperature characteristic line of the timer cycle. Thus, the temperature-dependency providing circuit may comprise a temperature-dependency varying circuit. Whereas the timer cycle is set with a priority to ensure the refresh operation at high temperature, it is possible to obtain appropriate refresh time intervals at ordinary or low temperatures.

A circuit configuration of the temperature-dependency varying circuit should not be limited, provided that the circuit has a function to vary the temperature-dependency. In one example of the circuit configuration, it is possible that the number of diodes D acting as rectifying devices is variable, while the plural diodes are connected in series in the primary side of the current mirror circuit. A circuit configuration for varying the number of the diodes D should not be limited, provided that there is a function therefor. In one example, it is possible that a switching device is connected in parallel to each diode D, so that a current path of the primary current of the current mirror circuit is variable, thereby to vary the number of the diodes D on the current path.

Instead of the above circuit configuration, the temperature-dependency providing circuit may comprise a circuit with a constant temperature-dependency or a constant temperature-dependent characteristic and also with a function of varying a current independent from temperature. The temperature-dependency providing circuit varies the current value depending upon temperature and in addition is configured to control the current value based on the control signal, so as to vary the current value depending upon not only temperature but also other factors, for example, active state and stand-by state of the device, thereby varying the timer cycle and varying the refresh time interval. Concretely, in the active state, the timer cycle is shorter than that in the stand-by state, to order to shorten the refresh time interval in the active state as compared to the stand-by state.

The temperature-dependency providing circuit should not be limited in its circuit configuration, provided that the circuit has the above functions. One example of the circuit configuration may comprise a series connection of a rectifying device with a temperature-dependent current characteristic and a variable resistance circuit varying its resistance value based on the control signal. This variable resistance circuit should not be limited in its circuit configuration, provided that the circuit has a function of varying its resistance value based on the control signal. One example of the circuit configuration may comprise a series connection of plural resistances and a by-pass providing circuit element for selectively forming a by-pass to at least one resistance. This by-pass path providing circuit element should not be limited in its element type, provided the element has a function of selectively forming the by-pass to the resistance based on the control signal. One example of the by-pass path providing circuit element may comprise a switching transistor connected in parallel to the resistance.

The rectifying device with the temperature-dependent current characteristic may comprise a series connection of one or more diodes D showing temperature-dependent current characteristic.

Instead of the above configuration, the pulse generating circuit with the function of varying the pulse width in accordance with the present invention may comprise a pulse generating circuit outputting a first pulse signal, a pulse signal cycle varying circuit connected to this pulse generating circuit for varying a cycle of the first pulse signal and outputting a second pulse signal with a different cycle from the first pulse cycle, and a selecting circuit connected to the pulse generating circuit and the pulse signal cycle varying circuit for selecting one of the first and second pulse signals and outputting the selected one.

The pulse generating circuit outputting the first pulse signal may comprise one of the novel timer circuits in the foregoing embodiments 1–3 or a know pulse generating circuit, for example, the conventional timer circuit shown in FIG. 1.

The above-described pulse signal cycle varying circuit should not be limited in its circuit type or circuit configuration, provided that the circuit has a function of varying the cycle of the first pulse signal. One example of the pulse signal cycle varying circuit may comprise a binary counter which divides the cycle or frequency of the first pulse signal. The binary counter divides the cycle of the first pulse signal and outputs the second pulse signal with the different cycle from the first pulse signal.

The selecting circuit should not be limited in its circuit type or circuit configuration, provided that the selecting circuit selects one of the first and second pulse signals based on a control signal and outputs the selected one. One example of the selecting circuit may comprise a multiplexer. The multiplexer selects one of the first pulse signal from the pulse generating circuit and the second pulse signal from the pulse signal cycle varying circuit based on the control signal and outputs the selected one.

For example, if the device is in the stand-by state, the selecting circuit selects and outputs the second pulse signal. If the device is in the active state, the selecting circuit selects and outputs the first pulse signal. As a result, in the active state, the refresh time interval is shortened to avoid the considerable interference of data. In the stand-by state, the refresh time interval is increased to suppress the current comsumption for the refresh operation.

Figure 11:
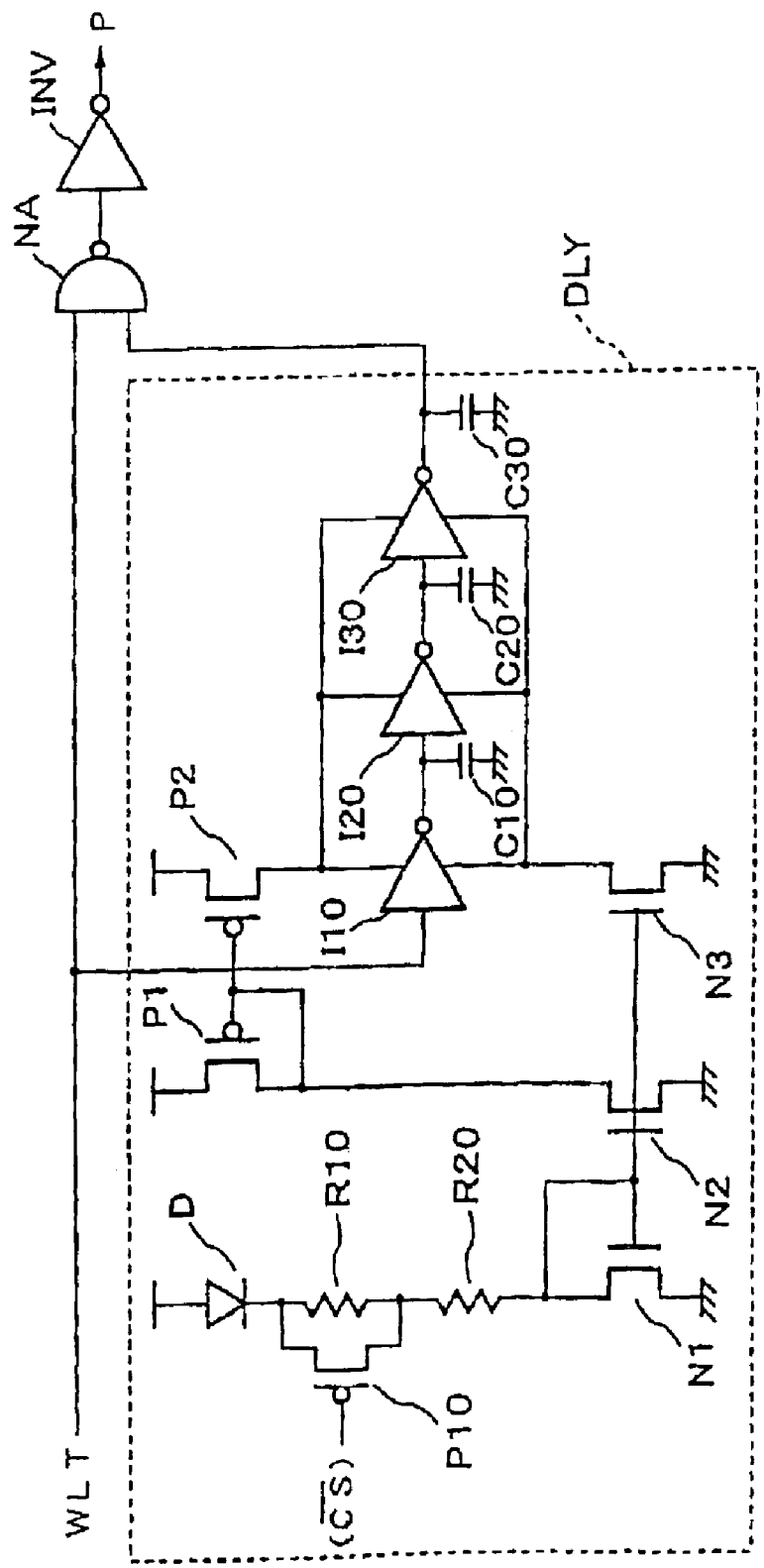
FIG. 11 is a circuit diagram showing a configuration of a word pulse generating circuit provided in a semiconductor memory device in accordance with a fifth embodiment of the present invention.

FIG. 11 shows a circuit configuration of a word pulse generating circuit in a semiconductor memory device as one example of the circuit configuration of the pulse generating circuit with the function of varying the pulse width in accordance with the embodiment 5. This word pulse generating circuit comprises a delay circuit DLY for delaying a trigger signal WLT as a trigger for a word pulse, a NAND-gate NA with inputs of the trigger signal WLT and the output signal from the delay circuit DLY and an inverter INV with an input of the output signal from the NAND-gate NA. An output signal from the inverter INV I a word pulse P. As the trigger signal WLT, the address transition detection signal φ ATD outputted from the pulse generator 3 is used.

The delay circuit DLY may be configured by replacing the inverters I1~I3 and the capacitors C1~C3 shown in FIG. 4 of the timer circuit in accordance with the above-described embodiment 3 into an inverter chain which comprises inverters I10~I30 and capacitors C10~C30. The signal WLT is inputted into the inverter I10 on the first stage, while an output signal from the inverter I30 on the final stage is inputted into the above-described NAND-gate NA. Other configurations are similar to the timer circuit of the embodiment 3.

Operations of the word pulse generating circuit in accordance with this embodiment 5 will subsequently be described.

In the initial state, the signal WLT as the trigger for the word pulse is in the low level "L". In this state, as described above, the driving current is supplied through the p-channel MOS transistor P2 and the n-channel MOS transistor N3 to the inverters I10~I30, and a signal of high level "H" is outputted from the inverter I30 and supplied to the NAND-gate NA. In the initial state, one input of the NAND-gate NA is supplied with the signal; WLT of the low level "L" and another input thereof is supplied with the signal of high level "H" from the delay circuit DLY, whereby the word pulse P outputted from the inverter INV is low level "L".

If the signal WLT is transitioned into the high level "H" from the initial state, the NAND-gate NA outputs the low level "L" in response thereto, and the word pulse P outputted from the inverter INV is transitioned into the high level "H". At this time, the output signal from the delay circuit DLY remains high level "H". The signal WLT is transmitted through the inverters I10~I30 and after a predetermined time of the inverter chain passes, the low level "L" is outputted from the inverter I30. The NAND-gate NA receives the low level "L" from the inverter I30 and outputs the high level "H". As a result, the word pulse P outputted from the inverter INV is transitioned into the low level "L". Namely, the word pulse is generated by triggering the rising edge of the signal WLT.

At this time, the driving current supplied to the inverters I10~I30 is, as similarly to the above-described timer circuit, is controlled by a current which flows through the diode D, the resistances R10 and R20, and the n-channel MOS transistor N1. As the temperature is increased, the driving current supplied to the inverters I10~I30 is increased, whereby a propagation time in those inverters is shortened. As a result, the pulse width of the word pulse is shortened. If the temperature is decreased, the driving current supplied to the inverters I10~I30 is decreased, whereby the propagation time in those inverters is made longer. As a result, the pulse width of the word pulse is widened.

If the chip select signal/CS is low level "L" or the device is in the active state, then the p channel MOS transistor P10 is made into the conductive state, whereby the resistance R10 is by-passed, and the current flowing through the n-channel MOS transistor N1 is increased. As a result, the driving current supplied to the inverters I10~I30 is increased, whereby the propagation time in those inverters I10~I30 is shortened. As a result, the pulse width of the word pulse P or the word pulse width is shortened.

If the chip select signal/CS is high level "H" or the device is in the stand-by state, then the p-channel MOS transistor P10 is made into the non-conductive state, whereby the resistance R10 acts as the resistance, and the current flowing through the n-channel MOS transistor N1 is decreased. The pule width of the word pulse is widened.

As described above, in accordance with the embodiment 5, the pulse width of the word pulse may be controlled in accordance with temperature, the operational states, for example, the stand-by state or the active state.

Embodiment 6

The embodiment 6 of the present invention will subsequently be described.

Whereas the temperature dependency is intended to be provided to the timer cycle or the pulse width in the above-described embodiments 1–5, in accordance with this timer circuit of this embodiment 6 is configured in consideration of a further dependency upon power voltage variation. As described above with reference to the prior art, the data holding characteristic of the memory cell is generally flat over the power voltage. Thus, it is desired that the timer cycle is also flat over the power voltage. In this embodiment 6, an example of the circuit configuration of the timer circuit which shows a timer cycle characteristic being flat over the power voltage and another example of the circuit configuration of the timer circuit which shows a timer cycle characteristic being dependent upon the power voltage.

A first circuit configuration of the timer circuit in accordance with the embodiment 6 will further be described. This first circuit configuration comprises a constant voltage generating circuit for generating a power voltage, a power circuit being connected to this constant voltage generating circuit for generating a power current provided with a temperature dependency from the constant voltage outputted from the constant voltage generating circuit, and a clock generating circuit connected to an output side of this power circuit for generating a clock signal with a temperature-dependent cycle. The temperature-dependency providing circuit of the timer circuit is applied with a constant voltage which is always constant and independent from the power voltage variation, so that the timer cycle of the timer circuit is independent from the power voltage variation. Upon temperature increase, the power circuit increases the power current to decrease a clock cycle or the timer cycle, and upon temperature decrease, the power circuit decreases the power current to increase the clock cycle or the timer cycle.

Figure 12:
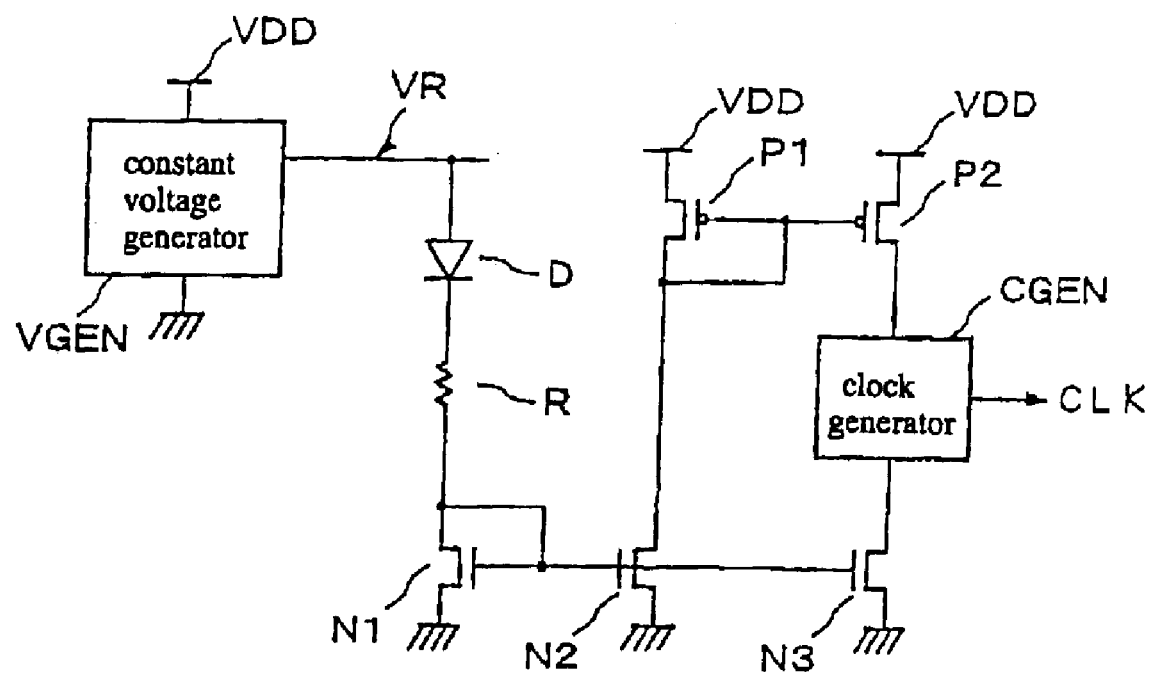
FIG. 12 is a circuit diagram showing a first example of the configuration of the timer circuit in accordance with a sixth embodiment of the present invention.

FIG. 12 shows the first example of the circuit configuration of the timer circuit in accordance with the embodiment 6. In this first example of the circuit configuration, the temperature-dependency providing circuit of the timer circuit is applied with a constant voltage which is always constant and independent from the power voltage variation, so that the timer cycle of the timer circuit is independent from the power voltage variation.

The first example of the circuit configuration of the timer circuit in accordance with the embodiment 6 includes the same circuit configuration as the timer circuit in accordance with the embodiment 1. An output port of a constant voltage generating circuit VGEN is connected to an input port of the temperature-dependency providing circuit of the timer circuit. The temperature-dependency providing circuit comprises a series connection of the diode D and the resistance R. An output port of the constant voltage generating circuit VGEN is connected to an anode of the diode D. The constant voltage generating circuit VGEN generates the constant voltage VR upon apply of the power voltage VDD. This voltage VR is kept almost constant even any variations appear on the power voltage VDD. The almost constant voltage VR outputted from the constant voltage generating circuit VGEN is applied to the anode of the diode D, whereby the primary current being kept almost constant flows through the temperature-dependency providing circuit which comprises the series connection of the diode D and the resistance R. The configuration and operation of the current mirror circuit are as described in the above-described embodiment 1.

Further, the first example of the circuit configuration of the timer circuit in accordance with the embodiment 6 has a clock generating circuit CGEN in the output side of the current mirror circuit. A circuit configuration of the clock generating circuit CGEN is the same as the circuit configuration of the clock generating circuit of the timer circuit in accordance with the embodiment 1. Namely, the clock generating circuit CGEN comprises the inverters I1~I3, the capacitors C1~C3 and the buffer circuit B shown in FIG. 4.

In the Figure, the common elements to the timer circuit of the irst embodiment 1 and shown in FIG. 4 are given the same reference numbers and duplicate descriptions will be avoided.

In accordance with the timer circuit of the embodiment 6, the voltage VR applied to the anode of the diode D is kept constant and independent from the variation of the power voltage VDD, so that the primary current flowing through the transistor N1 of the current mirror circuit is independent from the variation of the power voltage VDD and is kept constant. As a result, the secondary current flowing through the p-channel MOS transistor P2 with a source supplied with the power voltage VDD is also independent from the variation of the power voltage VDD. Thus, the timer cycle or the cycle of the clock signal CLK outputted from the clock generating circuit CGEN receiving the current supply through the p-channel MOS transistor P2 is independent from the variation of the power voltage VDD and is kept constant.

As described above, in accordance with the first circuit configuration in accordance with the embodiment 6, the timer cycle or the cycle of the clock signal CLK is provided with the temperature dependency only and is independent from the variation of the power voltage VDD.

A second circuit configuration of the timer circuit in accordance with the embodiment 6 will further be described. This second circuit configuration comprises a constant voltage generating circuit for generating a power voltage from the power voltage, a power circuit being connected to this constant voltage generating circuit for generating a power current provided with a temperature dependency from the constant voltage outputted from the constant voltage generating circuit outputted from the constant voltage generating circuit, and a clock generating circuit connected to an output side of this power circuit for generating a clock signal with a temperature-dependent cycle. The power circuit has such a temperature-dependency that upon temperature increase, the power circuit increases the power current to decrease a clock cycle or the timer cycle, and upon temperature decrease, the power circuit decreases the power current to increase the clock cycle or the timer cycle.

The power circuit comprises a circuit element connected to the constant voltage generating circuit for dropping a level of the constant voltage outputted from the constant voltage generating circuit; a current mirror circuit; and a temperature-dependency providing circuit being connected to a primary side of the current mirror circuit and also to the circuit element dropping the constant voltage level for receiving the constant voltage dropped in level and supplying a primary current with a temperature-dependency to the current mirror circuit based on the constant voltage dropped in level, and the current mirror circuit generates, in its secondary side, a power current provided indirectly with a temperature-dependency in accordance with the primary current with the temperature-dependency.

The temperature-dependency providing circuit may comprise a circuit with a constant temperature-dependency or a constant temperature-dependent characteristic, and for example, may comprise a series connection of a rectifying device with the temperature-dependent current characteristic and the resistance R.

The rectifying device with the temperature-dependent current characteristic may comprise a series connection of one or more diodes D showing the temperature-dependent current characteristic.

The constant voltage level drop circuit element may, for example, comprise a field effect transistor being connected in series between the power voltage VDD and the temperature-dependency providing circuit, and its gate is connected to an output side of the constant voltage generating circuit. Instead of the field effect transistor, the constant voltage level drop circuit element may comprise a bipolar transistor with a collector connected to the power voltage VDD, an emitter connected to the temperature-dependency providing circuit, and a base connected to the output side of the constant voltage generating circuit.

The clock generating circuit may comprise a ring oscillator connected to an output side of the power circuit or a secondary side of the current mirror circuit for acting as a load to the secondary side of the current mirror circuit, and a buffer circuit B connected to an output side of the ring oscillator for generating a clock signal CLK with a temperature-dependent cycle. A level shifter may be realized by the known circuit configuration.

A second example of the circuit configuration in accordance with the embodiment 6 will subsequently be described. In the example shown in FIG. 12, the temperature-dependency providing circuit comprises a series connection of the diode D and the resistance R, and the constant voltage VR outputted from the constant voltage generating circuit VGEN is applied to the anode of the diode D. In contrast to this, in accordance with the second example of the circuit configuration in accordance with the embodiment 6, a switching device is provided between the temperature-dependency providing circuit and the power voltage, and a control terminal of this switching device is connected to an output port of the constant voltage generating circuit VGEN, so that the constant voltage VR outputted from the constant voltage generating circuit VGEN is applied to the control terminal of this switching device, and a constant voltage lower than the voltage VR is applied to the temperature-dependency providing circuit. Namely, if the temperature-dependency providing circuit comprises the series connection of the diode D and the resistance R, then a constant voltage lower than the voltage VR outputted from the constant voltage generating circuit VGEN is applied to the anode of the diode D.

Figure 13:
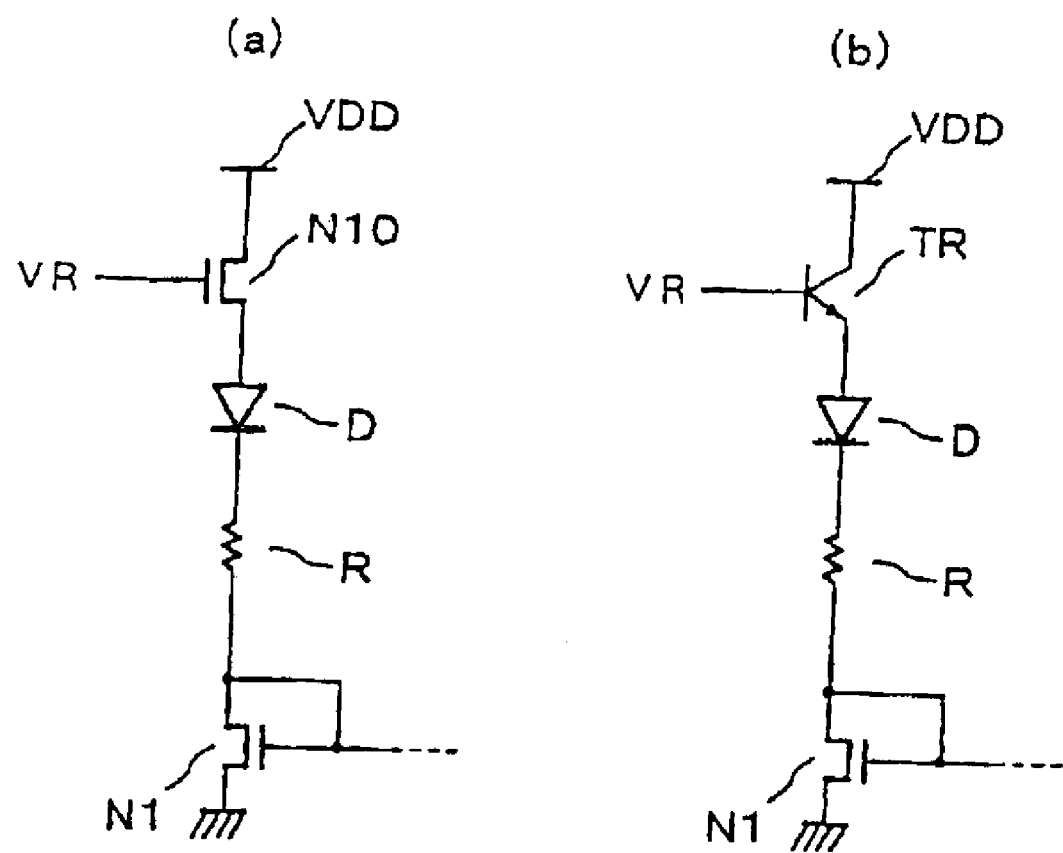
FIG. 13 is a circuit diagram showing second and third examples of the configuration of the timer circuit in accordance with the sixth embodiment of the present invention.

The switching device may, for example, comprise an n-channel MOS transistor and an n-p-n bipolar transistor. FIG. 13(a) shows one example of the switching device comprising an n-channel MOS transistor N10. FIG. 13(b) shows another example of the switching device comprising an n-p-n bipolar transistor TR.

As shown in FIG. 13(a), the n-channel MOS transistor N10 is provided in series between the power voltage VDD and the anode of the diode D, and its gate thereof is applied with the voltage VR outputted from the constant voltage generating circuit VGEN. In the example shown in FIG. 13(a), the anode of the diode D is connected to a drain of the n-channel MOS transistor N10, while a source thereof is supplied with the power voltage VDD, and a gate thereof is supplied with the voltage VR generated by the constant voltage generating circuit VGEN. A constant voltage lower than the voltage VR by a gate threshold voltage Vt of the n-channel MOS transistor N10 is applied to the anode of the diode D.

As shown in FIG. 13(b), the n-p-n bipolar transistor TR is provided in series between the power voltage VDD and the anode of the diode D, and its base thereof is applied with the voltage VR outputted from the constant voltage generating circuit VGEN. In the example shown in FIG. 13(b), the anode of the diode D is connected to a collector of the n-p-n bipolar transistor TR, while an emitter thereof is supplied with the power voltage VDD, and a base thereof is supplied with the voltage VR generated by the constant voltage generating circuit VGEN. A constant voltage lower than the voltage VR by a base-emitter voltage Vbe of the n-p-n bipolar transistor TR is applied to the anode of the diode D.

Employing the configurations shown in FIGS. 13(a) and 13(b) suppresses the current ability of the constant voltage generating circuit VGEN and simplifies the constant voltage generating circuit.

A third circuit configuration of the timer circuit in accordance with the embodiment 6 will further be described. This third circuit configuration comprises a constant voltage generating circuit for generating a power voltage from the power voltage, a power circuit being connected to this constant voltage generating circuit for generating a power current provided with a temperature dependency from the constant voltage outputted from the constant voltage generating circuit outputted from the constant voltage generating circuit, a clock generating circuit connected to an output side of this power circuit for generating a clock signal CLK with a temperature-dependent cycle, and a level shifter connected to an output side of the clock generating circuit for adjusting the voltage level of the clock signal CLK The power circuit has such a temperature-dependency that upon temperature increase, the power circuit increases the power current to decrease a clock cycle or the timer cycle, and upon temperature decrease, the power circuit decreases the power current to increase the clock cycle or the timer cycle.

The power circuit comprises a current mirror circuit connected to a constant voltage generating circuit for receiving a supply of a constant voltage outputted from the constant voltage generating circuit, and a temperature-dependency providing circuit being connected to a primary side of the current mirror circuit and also to the constant voltage generating circuit for receiving a supply of the constant voltage outputted from the constant voltage generating circuit and supplying a primary current with a temperature-dependency to the current mirror circuit based on the constant voltage, and the current mirror circuit generates, in its secondary side, a power current provided indirectly with a temperature-dependency in accordance with the primary current with the temperature-dependency.

The temperature-dependency providing circuit may comprise a circuit with a constant temperature-dependency or a constant temperature-dependent characteristic, and for example, may comprise a series connection of a rectifying device with the temperature-dependent current characteristic and the resistance R.

The rectifying device with the temperature-dependent current characteristic may comprise a series connection of one or more diodes D showing the temperature-dependent current characteristic.

The clock generating circuit may comprise a ring oscillator connected to an output side of the power circuit or a secondary side of the current mirror circuit for acting as a load to the secondary side of the current mirror circuit, and a buffer circuit B connected to an output side of the ring oscillator for generating a clock signal CLK with a temperature-dependent cycle. A level shifter may be realized by the known circuit configuration.

Figure 14:
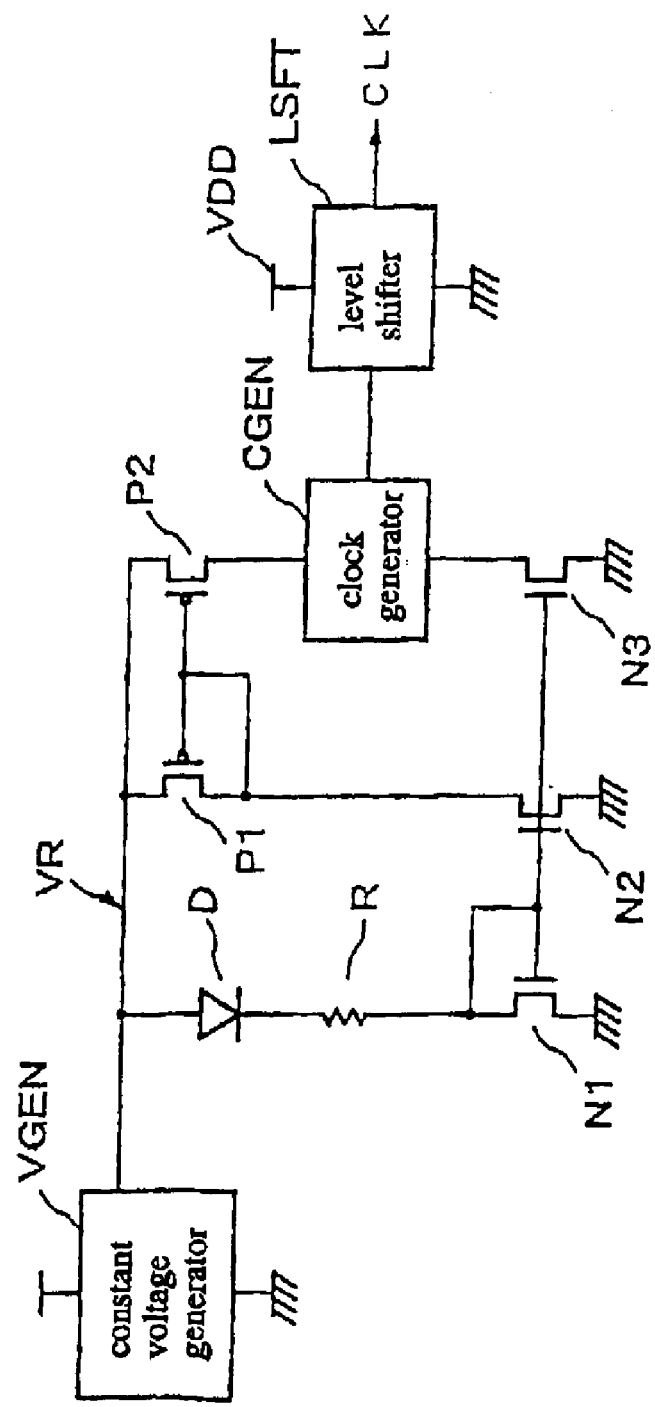
FIG. 14 is a circuit diagram showing a third example of the configuration of the timer circuit in accordance with the sixth embodiment of the present invention.

FIG. 14 shows the third example of the circuit configuration of the timer circuit in accordance with the embodiment 6. The third example of the circuit configuration is different from the above-described first example of the circuit configuration shown in FIG. 12 in view of the followings. In the first example of the circuit configuration shown in FIG. 12, the power voltage VDD is applied to the sources of the p-channel MOS transistors P1 and P2. In the third example of the circuit configuration shown in FIG. 14, the output port of the constant voltage generating circuit VGEN is connected to the anode of the diode D and the sources of the p-channel MOS transistors P1 and P2 in the current mirror circuit, so that the constant voltage VR outputted from the constant voltage generating circuit VGEN is applied not only to the anode of the diode D but also to the sources of the p-channel MOS transistors P1 and P2.

Further, a level shifter LSFT is provided in the output side of the constant voltage generating circuit VGEN. This level shifter LSFT is supplied with the power voltage VDD and converts an amplitude of the clock signal into so called to as MOS-level (0~VDD) for output the level-converted clock signal from the constant voltage generating circuit VGEN.

In accordance with this third example of the circuit configuration, the clock generating circuit CGEN outputs the clock signal with the amplitude of the voltage VR and the level shifter LSFT converts the amplitude of the output signal from the clock generating circuit CGEN into the MOS level. The sources of the p-channel MOS transistors P1 and P2 are supplied with the constant voltage VR, for which reason as compared to the above-described first circuit configuration, the power voltage dependency of the clock signal generated by the clock generating circuit CGEN may be further suppressed.

A fourth circuit configuration of the timer circuit in accordance with the embodiment 6 will further be described. This fourth circuit configuration comprises a first power circuit for generating a power current provided with a temperature dependency from the power voltage, a second power circuit connected to an output of a constant voltage generating circuit for generating a power current provided with a temperature dependency from the constant voltage outputted from the constant voltage generating circuit, and a clock generating circuit connected to output sides of the first and second power circuits for generating a clock signal CLK with a temperature-dependent cycle. The power circuit has such a temperature-dependency that upon temperature increase, the power circuit increases the power current to decrease a clock cycle or the timer cycle, and upon temperature decrease, the power circuit decreases the power current to increase the clock cycle or the timer cycle.

The first and second power circuits may be different from each other or identical with each other in the circuit configuration. The first power circuit comprises a first current mirror circuit and a first temperature-dependency providing circuit being connected to a primary side the first current mirror circuit for supplying a primary current with a temperature dependency to the first current mirror circuit. The first temperature-dependency providing circuit generates, from the power voltage and in its secondary side, a power current with a temperature-dependency according to a primary current with a temperature-dependency. The second power circuit comprises a second current mirror circuit and a second temperature-dependency providing circuit being connected to a primary side the second current mirror circuit for supplying a primary current with a temperature dependency to the second current mirror circuit, and the second temperature-dependency providing circuit generates a power current with a temperature-dependency from the constant voltage outputted from the constant voltage generating circuit and in its secondary side.

The first and second temperature-dependency providing circuits may be different from each other or identical with each other in view of the circuit configuration. In case of the same circuit configuration, the first and second temperature-dependency providing circuits may comprise a circuit with a constant temperature-dependency or a constant temperature-dependent characteristic, for example, may comprise a series connection of a rectifying device with a temperature-dependent current characteristic and a resistance R.

This rectifying device with the temperature-dependent current characteristic may comprise a series connection of one or plural diodes with the temperature-dependent current characteristic.

The clock generating circuit may comprise a ring oscillator connected to an output side of the power circuit or the secondary side of the current mirror circuit for acting as a load to the secondary side of the current mirror circuit, and a buffer circuit B connected to an output side of the ring oscillator for generating the clock signal CLK with the cycle depending upon temperature.

Figure 15:
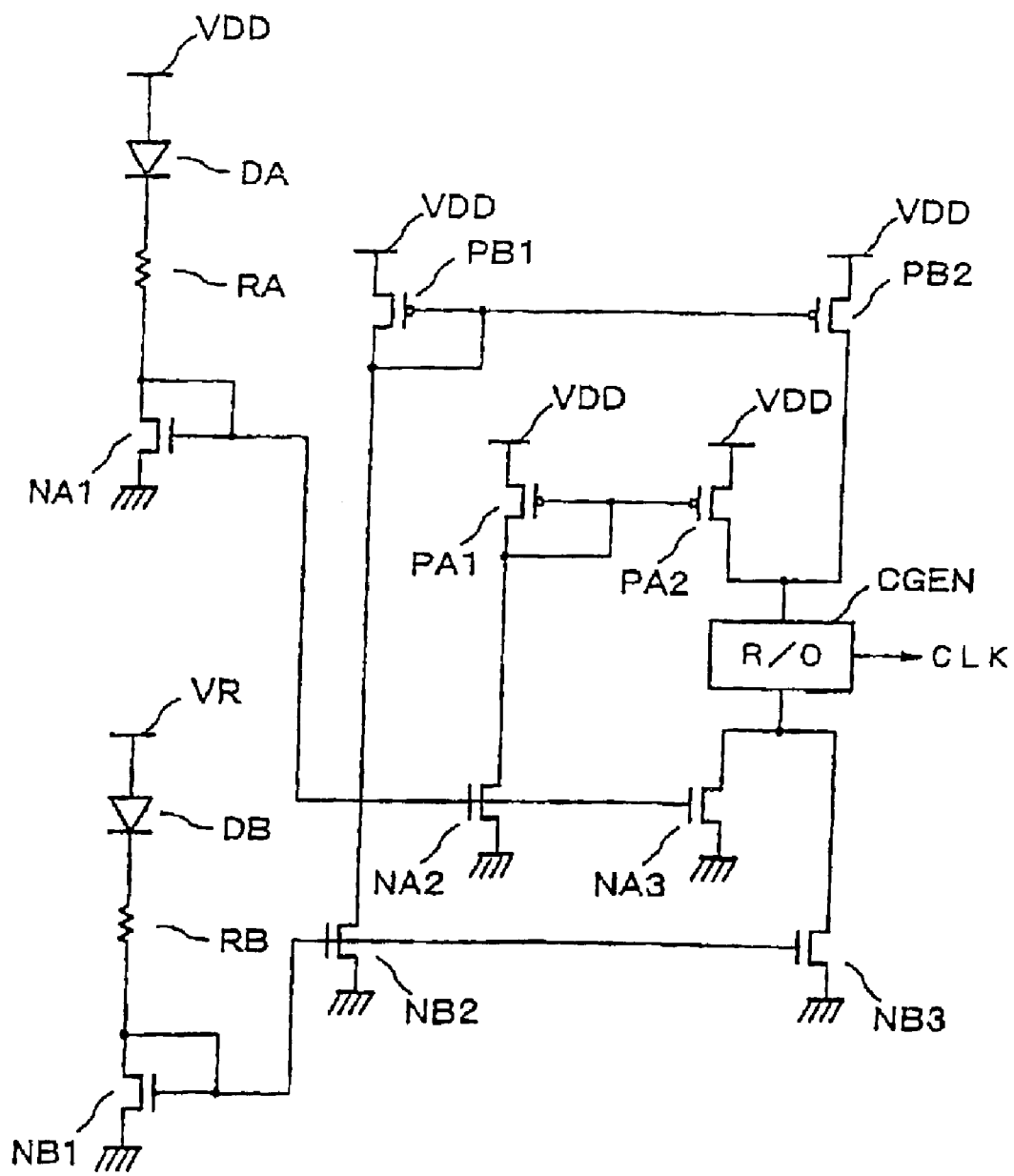
FIG. 15 is a circuit diagram showing a fourth example of the configuration of the timer circuit in accordance with the sixth embodiment of the present invention.

FIG. 15 shows the fourth example of the circuit configuration of the timer circuit in accordance with this embodiment 6. This fourth example of the circuit configuration comprises a combination of the above-described timer circuit shown in FIG. 4 in the embodiment 1 and the above-described first example of the circuit configuration shown in FIG. 12 in this embodiment 6. A diode DA, a resistance RA, n-channel MOS transistors NA1~NA3, and p-channel MOS transistors PA1 and PA2 shown in FIG. 15 would respectively correspond to the diode D, the resistance R, the n-channel MOS transistors N1~N3, and the p-channel MOS transistors P1 and P2 shown in FIG. 4. A diode DB, a resistance RB, n-channel MOS transistors NB1~NB3, and p-channel MOS transistors PB1 and PB2 shown in FIG. 15 would respectively correspond to the diode D, the resistance R, the n-channel MOS transistors N1~N3, and the p-channel MOS transistors P1 and P2 shown in FIG. 12. A clock generating circuit CGEN is the same as shown in FIG. 12 and comprises the inverters I1~I3, the capacitors C1~C3 and the buffer circuit B.

In accordance with this fourth example of the circuit configuration, a current flowing through the p-channel MOS transistor PA2 has a dependency upon the power voltage VDD and another dependency upon temperature. Another current flowing through the p-channel MOS transistor PA1 has a dependency upon temperature but independent from the power voltage VDD. It is possible to adjust the sensitivity to the power voltage VDD and also the dependency upon temperature.

Embodiment 7

The embodiment 7 in accordance with the present invention will be described.

In the above-described embodiments 1–6, the temperature-dependency is intended to be provided to the clock cycle of the clock signal or the timer cycle. This temperature dependency is such as to decrease the cycle upon temperature increase and increase the cycle upon the temperature decrease. The timer cycle of the timer circuit has such the temperature dependency that the power circuit supplying the current to the clock generating circuit increases the power current upon temperature increase to decrease the clock cycle or the timer cycle and decrease the power current upon temperature decrease to increase the clock cycle or the timer cycle.

The timer circuit in accordance with the embodiment 7 is a modified circuit to intentionally take a large variation rate of the timer cycle over temperature. As compared to the timer circuits of the embodiments 1–6, the timer circuit of the present embodiment 7 is to increase the increment of the cycle upon temperature drop and also increase the decrement of the cycle upon temperature rising, so that the timer cycle of the timer circuit has such a large temperature dependency that the power circuit supplying the current to the clock generating circuit largely decreases the power current upon temperature decrease to largely decrease the clock cycle or the timer cycle and largely decrease the power current upon temperature increase to largely increase the clock cycle or the timer cycle.

If the variation rate of the timer cycle versus the temperature variation is large, the power current from the power circuit is largely decreased upon temperature drop. For this reason, the power current is largely decreased and becomes zero in some cases. If the power current is zero, then the timer circuit is inoperable.

Thus, for designing the timer circuit under the conditions of allowing the power current to become zero, in order to avoid that the power current from the power circuit becomes zero upon temperature drop, the power circuit may additionally be provided with a current compensation circuit for ensuring a minimum power current to be supplied to the clock generating circuit, provided that this compensation current is independent from temperature, so that even if the main power current with the temperature dependency becomes zero upon temperature drop, the compensation current independent from temperature is always supplied to the clock generating circuit. The timer circuit may always output the clock signal with the clock cycle or the timer cycle based on the compensation current. It is necessary that the compensation current is at least a minimum current value which should be ensured even temperature drop appears, and is to provide a maximum timer cycle allowed at a low temperature or a lower timer cycle.

The current compensation circuit is not necessarily needed for designing the timer circuit under the conditions that it is impossible that the power current with the temperature dependency to be supplied to the lock generating circuit becomes zero. Namely, it is impossible that the current compensation circuit. The timer circuit in accordance with the embodiment 7 may be applicable to various circuits and device as described in the embodiments 1–6. If, for example, the timer circuit is applied to the semiconductor memory device, then the hold characteristic of the memory cell tends to be better at the ordinary or low temperature condition than that at the high temperature condition. It is possible, in case, that an inverse temperature dependent cycle of the timer circuit is set so that the cycle is very large under the high temperature conditions as compared to the ordinary or low temperature conditions, for example, by about one order or one digit. In this case, it is desired to provide the above-described inverse temperature dependency to the timer cycle of the timer circuit.

Accordingly, in this embodiment 7, there is provided a timer circuit with the above-described inverse temperature dependency and the current compensation circuit.

A first example of the circuit configuration of the timer circuit in accordance with the embodiment 7 will be described. The first example of the circuit configuration comprises a power circuit for generating a power current provided with a temperature-dependency and a clock generating circuit connected to an output side of this power circuit for generating a clock signal CLK with a cycle depending upon temperature from the power current from the power circuit. The power circuit has such a temperature dependency that upon temperature increase, the power circuit increases the power current to decrease a clock cycle or a timer cycle, and upon temperature decrease, the power circuit decreases the power current to increase the clock cycle or the timer cycle. A variation rate of the power current upon temperature variation is set large.

The power circuit comprises a current mirror circuit; a temperature-dependency providing circuit being connected to a primary side of the current mirror circuit for supplying a primary current with a temperature-dependency to the current mirror circuit; and a compensation current supplying circuit being connected to the primary side of the current mirror circuit for supplying a compensation current independent from temperature to the primary side of the current mirror circuit, and the current mirror circuit generates, in its secondary side, a power current provided indirectly with a temperature-dependency in accordance with the power current with the temperature-dependency and the compensation current independent from temperature.

The temperature-dependency providing circuit may comprise a circuit with a constant temperature-dependency or a constant temperature-dependent characteristic. This temperature-dependency should not necessarily be constant but may be variable. In case that the temperature-dependency providing circuit comprises the circuit with a constant temperature-dependency or a constant temperature-dependent characteristic, then the temperature-dependency providing circuit may comprise a series connection of one or plural rectifying devices with the temperature dependent current characteristic and the resistance R. It is desired that the plural rectifying devices are connected in series to set a large variation rate of the power current upon temperature variation. In case of the variable temperature dependency, the circuit configurations disclosed in the above-described embodiments 2 and 3 may, for example, be applicable.

The above-described rectifying device is a rectifying device which increases a current flowing through it upon temperature increase and may comprise a diode of a positive temperature characteristic. The diode with the positive temperature characteristic causes that the forward barrier potential Vf is decreased upon temperature increase, thereby increasing the forward current. The rectifying device may thus comprise one or plural diodes with the positive temperature characteristic connected in series. Namely, the rectifying device may comprise diodes with the same positive temperature characteristic as the diodes used in the above-described embodiments 1–6.

In case that this inverse-temperature-dependency providing circuit is a circuit for providing a large temperature dependency, the temperature drop may cause that the current with the temperature dependency supplied from the temperature-dependency providing circuit to the primary side of the current mirror circuit becomes zero. In this case, however, the compensation current supplying circuit always supplies the compensation current independent from temperature to the primary side of the current mirror circuit to avoid that the timer circuit will stop.

The clock generating circuit may comprise a ring oscillator connected to an output side of the power circuit or a secondary side of the current mirror circuit for acting as a load to the secondary side of the current mirror circuit, and a buffer circuit B connected to an output side of the ring oscillator for generating a clock signal CLK with a temperature-dependent cycle.

Figure 16:
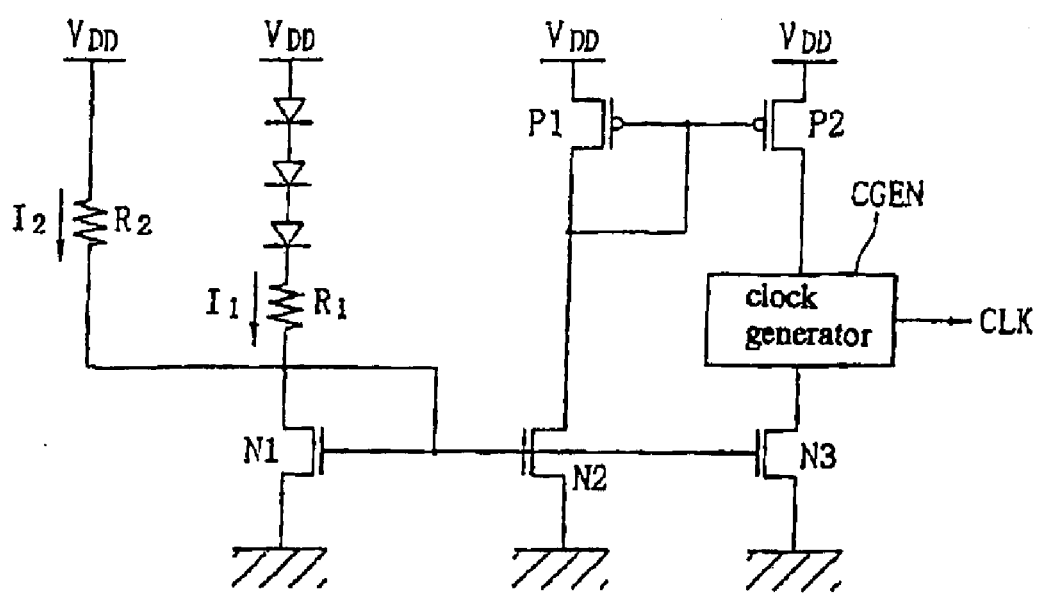
FIG. 16 is a circuit diagram showing a first example of the configuration of the timer circuit in accordance with a seventh embodiment of the present invention.

A variety of circuits may be available for realizing the first example of the circuit configuration of the timer circuit in accordance with this embodiment 7. One example is shown in FIG. 16. The first example of the circuit configuration is different from the circuit configuration of the timer circuit of the embodiment 1 in view of the circuit configuration of the temperature-dependency providing circuit and of further providing the compensation current supplying circuit, while the first example of the circuit configuration is identical with the circuit configuration of the timer circuit of the embodiment 1 in the other viewpoints. The temperature-dependency providing circuit comprises a series connection of the plural diodes D with the positive temperature characteristic and the resistance R, while the compensation current supplying circuit comprises a resistance R1 connected in series between the power voltage VDD and the primary side of the current mirror circuit. In FIG. 16, three diodes connected in series are shown. The number of the diodes D may be adjustable and should not be limited to three.

Increasing the number of the stages of the diodes D emphasizes the temperature dependency and increases the variation rate of the current over temperature. If the number of the stage of the diodes D is increased, then the rate of decreasing the power current upon temperature decrease becomes large, and the rate of increasing the clock cycle or the timer cycle becomes also large. The rate of increasing the power current upon temperature increase becomes also large and the rate of decreasing the clock cycle or the timer cycle becomes also large. If the number of the stages of the diodes D is increased and if the temperature is largely decreased, it is possible, in case, that the current supplied from the temperature-dependency providing circuit to the primary side of the current mirror circuit becomes zero. The compensation current supplying circuit comprising the resistance R1 connected in series between the power voltage VDD and the primary side of the current mirror circuit always supplies the compensation current independent from temperature to the primary side of the current mirror circuit to avoid that the timer circuit will stop.

Decreasing the number of the stages of the diodes D weakens the temperature dependency and decreases the variation rate of the current over temperature. If the number of the stage of the diodes D is decreased, then the rate of decreasing the power current upon temperature decrease becomes small, and the rate of increasing the clock cycle or the timer cycle becomes also small. The rate of increasing the power current upon temperature increase becomes also small and the rate of decreasing the clock cycle or the timer cycle becomes also small.

The number of the stages of the diodes D may be adjusted so that a current value I1 with the temperature dependency, which is supplied from the temperature-dependency providing circuit comprising the series connection of the plural diodes D and the resistance R to the primary side of the current mirror circuit, is larger than a compensation current value I2 independent from temperature, which is supplied from the compensation current supplying circuit. If the current value I1 is about 10 times of the current value I2, then a large inverse temperature dependency of one digit order can be obtained. At the ordinary temperature or the low temperature, the clock cycle or the timer cycle is larger by one digit order than that at the high temperature.

Further, this first example of the circuit configuration of the timer circuit in accordance with the present embodiment 7 has a clock generating circuit CGEN at the output side of the current mirror circuit. The circuit configuration of the clock generating circuit CGEN is the same as that of the clock generating circuit of the timer circuit in accordance with the above-described embodiment 1. Namely, the clock generating circuit CGEN comprises the inverters I1~I3, the capacitors C1~C3 and the buffer circuit B shown in FIG. 4.

In Figure, the common elements to the constitutional elements of the timer circuit shown in FIG. 4 in the embodiment 1 are provided with the same reference numbers and duplicate descriptions will be omitted.

A second example of the circuit configuration of the timer circuit with the inverse temperature dependency in accordance with the embodiment 7 will subsequently be described. The second example of the circuit configuration comprises a constant voltage generating circuit for generating a constant voltage from a power voltage, a power circuit connected to the constant voltage generating circuit for generating a power current provided with a temperature-dependency from the constant voltage outputted from the constant voltage generating circuit, and a clock generating circuit connected to an output side of this power circuit for generating a clock signal CLK with a cycle depending upon temperature. The power circuit has such a temperature dependency that upon temperature decrease, the power circuit largely decreases the power current to largely increase a clock cycle or a timer cycle, and upon temperature increase, the power circuit largely increases the power current to largely decrease the clock cycle or the timer cycle.

The power circuit comprises: a constant voltage level drop circuit element connected to the constant voltage generating circuit for dropping the level of the constant voltage outputted from the constant voltage generating circuit; a fist current mirror circuit; a temperature-dependency providing circuit being connected to a primary side of the current mirror circuit and also connected to the constant voltage level drop circuit element for receiving the level-dropped constant voltage and supplying a primary current with a temperature-dependency to the current mirror circuit based on the level-dropped constant voltage; and a compensation current supplying circuit being connected to the primary side of the current mirror circuit in parallel to the temperature-dependency providing circuit for supplying a compensation current independent from temperature to the primary side of the current mirror circuit, and the current mirror circuit generates, in its secondary side, a power current provided indirectly with a temperature-dependency in accordance with the primary current with the temperature-dependency.

The temperature-dependency providing circuit may comprise a second current mirror circuit.

A first side of the second current mirror circuit comprises a series connection of a first field effect transistor and a resistance element, while a second side thereof comprises a series connection of a second field effect transistor and a rectifying device with a positive temperature dependency. Gates of the first and second field effect transistors are commonly connected to an input of the second current mirror circuit. The rectifying device with the temperature characteristic is a rectifying device such that the barrier potential is decreased upon temperature increase, whereby the current flowing through the rectifying device is increased. The rectifying device with the temperature characteristic may comprise plural-staged diodes with the positive temperature characteristic. The diode with the positive temperature characteristic causes that upon temperature increase, the forward barrier potential Vf is decreased and the forward current is increased.

The constant voltage level drop circuit element may, for example, comprise a field effect transistor connected in series between the above-described power voltage VDD and the above-described temperature-dependency providing circuit, and its gate is connected to an output of the constant voltage generating circuit. Instead of the field effect transistor, the constant voltage level drop circuit element may comprise a bipolar transistor with a collector connected to the power voltage VDD, an emitter connected to the temperature-dependency providing circuit, and a base connected to the output side of the constant voltage generating circuit.

The temperature-dependency providing circuit is a circuit for providing a large temperature dependency to the clock generating circuit, wherein it is possible that upon temperature drop, the temperature dependent current supplied from the temperature-dependency providing circuit to the primary side of the current mirror circuit becomes zero. In this case, however, the compensation current supplying circuit always supplies the compensation current independent from temperature to the primary side of the current mirror circuit to avoid that the timer circuit will stop.

The clock generating circuit may comprise a ring oscillator connected to an output side of the power circuit or a secondary side of the current mirror circuit for acting as a load to the secondary side of the current mirror circuit, and a buffer circuit B connected to an output side of the ring oscillator for generating a clock signal CLK with a temperature-dependent cycle.

Figure 17:
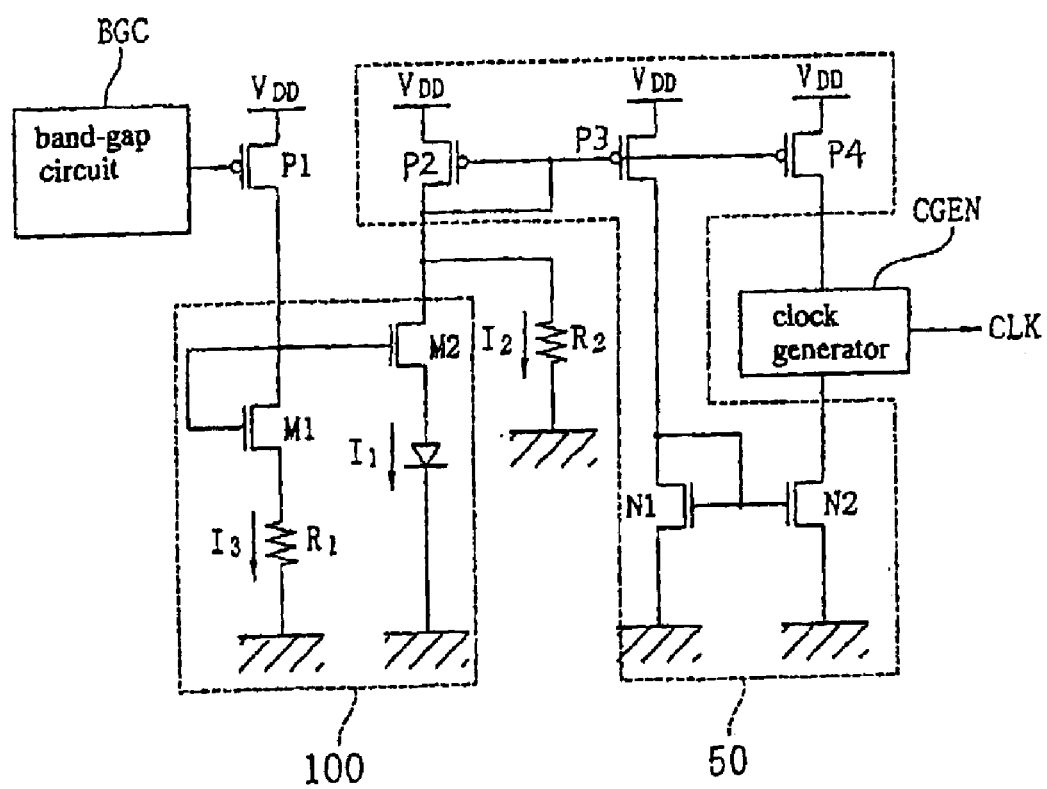
FIG. 17 is a circuit diagram showing a second example of the configuration of the timer circuit in accordance with the seventh embodiment of the present invention.

A variety of circuits may be available for realizing the second example of the circuit configuration of the timer circuit in accordance with this embodiment 7. One example is shown in FIG. 17. One example of the constant voltage generating circuit for generating the constant voltage from the power voltage may comprise a band-gap circuit BGC. An output of the band-gap circuit BGC is connected to the gate of the p-channel MOS transistor P1 which is connected in series between the power voltage VDD and the input side of the temperature-dependency providing circuit. The temperature-dependency providing circuit may comprise a second current mirror circuit 100. A primary side of the second current mirror circuit 100 comprises a series connection 10 of an n-channel MOS transistor M1 and a first resistance R1. A secondary side of the second current mirror circuit 100 comprises a series connection of an n-channel MOS transistor M2 and a diode D. In the example shown in FIG. 17, the single-staged diode D is provided as the rectifying device with the temperature dependency. It is possible that a plurality of diode stages may be provided for increasing the temperature dependency of the power current and a very large variation rate of the power current over temperature can be obtained.

The secondary side of the second current mirror circuit 100 is connected to a primary side of a first current mirror circuit 50. The compensation current supplying circuit may comprise a second resistance R2 connected in series between the ground and the primary side of the first current mirror circuit 50. The second current mirror circuit 100 constituting the temperature-dependency providing circuit and the second resistance R2 constituting the compensation current supplying circuit are connected to the primary side of the first current mirror circuit 50 in parallel to each other.

The first current mirror circuit 50 may comprise three p-channel MOS transistors P2, P3 and P4 and two n-channel MOS transistors N1 and N2. Sources of the p-channel OS transistors P2, P3 and P4 are connected to the power voltage VDD. Gates of the p-channel MOS transistors P2, P3 and P4 are connected to a drain of the p-channel MOS transistor P2. A drain of the p-channel MOS transistor P1 is connected to the secondary side of the second current mirror circuit 100 and also connected to the second resistance R2 constituting the compensation current supplying circuit. A drain of the p-channel MOS transistor P4 is connected to the clock generating circuit CGEN. Transconductances gm2 and gm3 of the p-channel MOS transistors P1 and P3 are equal to each other. A transconductance gm4 of the p-channel MOS transistor P4 is larger by an integer number time than that of the p-channel MOS transistor P2. The p-channel MOS transistors P2 and P4 are connected to a power node of the inverters of the clock generating circuit CGEN.

Sources of the n-channel MOS transistors N1 and N2 are commonly connected to a ground. Gates of the n-channel MOS transistors N1 and N2 are connected to a drain of the n-channel MOS transistor N1. A drain of the n-channel MOS transistor N2 is connected to respective ground nodes of the inverters of the clock generating circuit CGEN. A drain of the n-channel MOS transistor N1 is connected to a drain of the p-channel MOS transistor P3. A transconductance gm6 of the n-channel MOS transistor N2 is set at such an appropriate value as to provide the power potential to the inverters. A transconductance gm5 of the n-channel MOS transistor N1 is larger by two times than that of the n-channel MOS transistor N2. The n-channel MOS transistors N1 and N2 supply the ground potential to the inverters.

Figure 18:
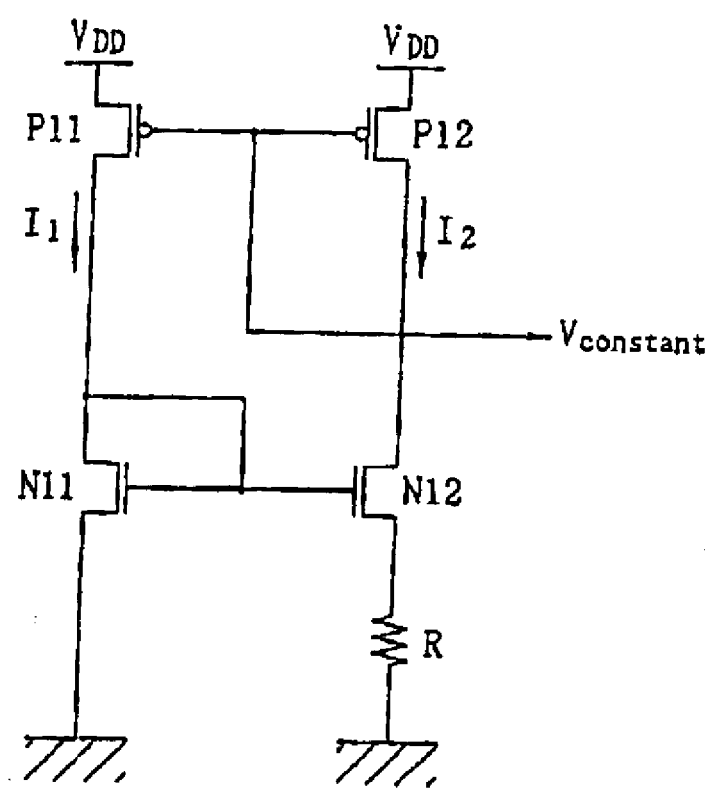
FIG. 18 is a circuit diagram showing an example of a configuration of a band gap circuit usable for the timer circuit of FIG. 17.

FIG. 18 shows an example of the circuit configuration of the above-described band-gap circuit BGC. The band-gap circuit BGC may comprise a resistance R, two n-channel MOS transistors N11 and N12 and two p-channel MOS transistors and P12. Sources of the p-channel MOS transistors P11 and P12 are connected to the power voltage VDD. Gates of the p-channel MOS transistors P11 and P12 are connected to a drain of the p-channel MOS transistor P12. The drain of the p-channel MOS transistor P12 is connected to an output of the band-gap circuit BGC. A source of the n-channel MOS transistor N11 is directly connected to the ground. A source of the n-channel MOS transistor N12 is connected through the resistance R to the ground. Gates of the n-channel MOS transistors N11 and N12 are connected to a drain of the n-channel MOS transistor N11. The drain of the n-channel MOS transistor N11 is connected to the drain of the p-channel MOS transistor P11.

The n-channel MOS transistor N11 and the p-channel MOS transistor P12 have diode connections, and the n-channel MOS transistor N12 is connected through the resistance R to the ground, so that the constant voltage independent from the power voltage and temperature is outputted.

The circuit shown in FIG. 18 is only one example, but other circuit configurations may be applicable, provided that the circuit may output the constant voltage independent from the power voltage and temperature or so slightly dependent upon temperature as to be compensated.

Figure 19:
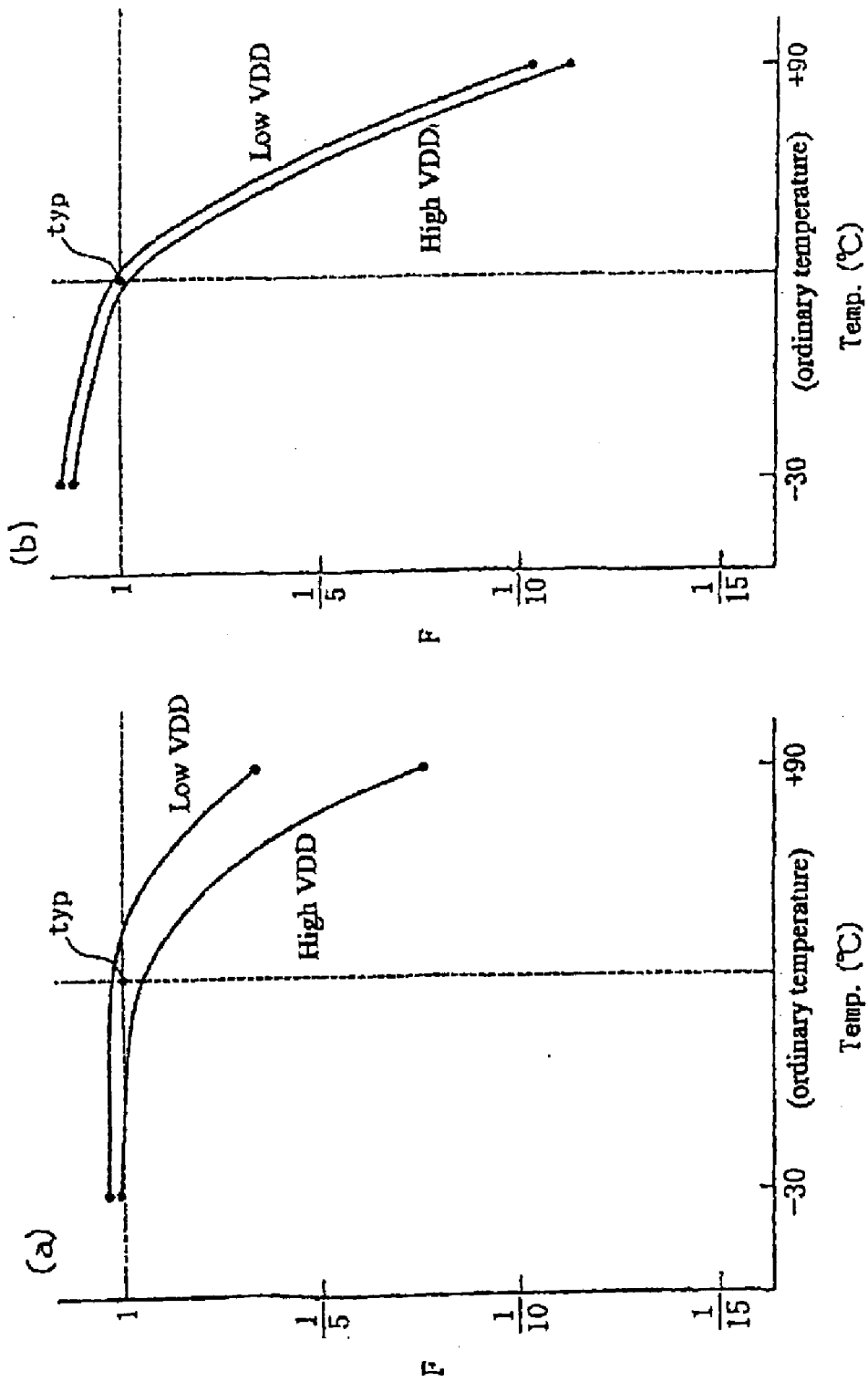
FIG. 19 is a schematic view showing a temperature-dependency of a timer cycle of a timer circuit shown in FIGS. 16 and 17.

Temperature characteristic curves obtained from the above-described first and second circuit configurations shown in FIGS. 16 and 17 in this embodiment 7 are shown in FIGS. 19(a) and 19(b) respectively.

As shown in FIGS. 19(a) and 19(b), variation rates of the power currents over temperature variations of the above-described first and second circuit configurations of the timer circuits in the embodiment 7 are very large, and the temperature characteristic curves have large gradients. Concretely, the clock cycle or the timer cycle outputted from the clock generating circuit at the low temperature or the ordinary temperature is different by one digit order than that at the high temperature. In a temperature range less than a temperature T1, the cycle of the clock signal outputted from the clock generating circuit or the timer cycle is constant and independent from temperature. This means that in the temperature range less than the temperature T1, the temperature dependent current outputted from the temperature-dependency providing circuit becomes zero, and only the temperature-independent compensation current supplied from the compensation current supplying circuit is supplied to the clock generating circuit, whereby the timer cycle based on the compensation current is obtained.

Whereas the embodiments of the present invention have been described, the present invention should not be limited to those embodiments but may include design changes in the context of the subject matter of the present invention.

Although in the above-described embodiments 1–7, the temperature characteristics of the diodes reflect to the timer cycle, any devices may be used, provided the device has a characteristic which increases the current upon temperature increase.

Further, in the above-described embodiments 1–7, there are provided a current mirror circuit comprising n-channel MOS transistors N1 and N3 and another current mirror circuit comprising p-channel MOS transistors P1 and P2. The circuit configuration should not be limited thereto but may include any of those circuit elements.

In the above-described embodiments 1–4, the n-channel MOS transistor N2 is provided as a load to the primary side of the current mirror circuit which comprises the p-channel MOS transistors P1 and P2. The circuit configuration should not be limited thereto but may provide an element corresponding to the diode D and the resistance R between the ground and the p-channel MOS transistor P1.

Industrial Applicability:

The present invention provides the following effects.

In accordance with the timer circuit of the present invention, there are provided the power circuit with the rectifying device with the temperature-dependent current characteristic for generating the power current in response to the current flowing through the rectifying device, and the clock generating circuit for receiving the power from the power circuit and generating the clock signal, so that the timer cycle is decreased upon temperature increase and increased upon temperature decrease.

The semiconductor memory device in accordance with the present invention is capable of control any excess refresh operation under the typical conditions with ensuring the refresh operation under the worst conditions.

What is claimed is:

1. A timer circuit generating a signal which defines a refresh cycle of memory cells dynamically storing data, wherein a cycle of said signal is controlled in accordance with a temperature-dependency of data holding time of said memory cells, and wherein said timer circuit further includes a circuit that controls a variable temperature-dependency of said cycle of said signal using a rectifying device having at least one diode that is controlled to perform rectifying operations for changing said variable temperature dependency, a power circuit for generating a power current in response to a current flowing through said rectifying device, and a clock generating circuit for receiving a supply of a power from said power circuit and generating a clock signal.

2. The timer circuit as claimed in claim 1, wherein said cycle of said signal is decreased upon temperature increase.

3. The timer circuit as claimed in claim 1, wherein said timer circuit comprises a rectifying device with a temperature-dependent current characteristic, a power circuit for generating a power current in response to a current flowing through said rectifying device, and a clock generating circuit for receiving a supply of a power from said power circuit and generating a clock signal.

4. The timer circuit as claimed in claim 1, wherein said cycle of said signal in a stand-by state is longer than said cycle of said signal in an active state.

5. The timer circuit as claimed in claim 3, wherein said rectifying device includes at least one diode connected in series to a power supply.

6. The timer circuit as claimed in claim 5, wherein said rectifying device includes a resistance connected in series between said diode and a ground and a MOS transistor connected in parallel to said resistance, and a conductive state or a non-conductive state of said MOS transistor is controlled by a signal which switches the device between in a stand-by state and in an active state.

7. The timer circuit as claimed in claim 3, wherein said rectifying device includes a diode connected in series to an output of a constant voltage generating circuit.

8. The timer circuit as claimed in claim 3, wherein said rectifying device includes transistor connected in series between a power supply and a diode and receiving an input of an output signal from a constant voltage generating circuit.

9. The timer circuit as claimed in claim 3, further comprising a current compensating circuit with a temperature-independent current characteristic, and said power circuit generates a power current in response to a current which flows through said rectifying device and said current compensating device.

10. The timer circuit as claimed in claim 9, wherein said current compensating device includes a resistance element connected in parallel to said rectifying device.

11. The timer circuit as claimed in claim 9, wherein said rectifying device is supplied with a voltage level fallen by a predetermined level from an output level from a constant voltage generating circuit.

12. The timer circuit as claimed in claim 11, wherein said constant voltage generating circuit is a band-gap circuit.

13. A timer circuit generating a signal which defines a refresh cycle of memory cells dynamically storing data, wherein a cycle of said signal is controlled in accordance with a temperature-dependency of data holding time of said memory cells, wherein said timer circuit comprises a rectifying device with a temperature-dependent current characteristic, a power circuit for generating a power current in response to a current flowing through said rectifying device, and a clock generating circuit for receiving a supply of a power from said power circuit and generating a clock signal, and
wherein said rectifying device has a temperature characteristic varying circuit, and said temperature characteristic varying circuit includes a plurality of diodes connected in series and a by-pass circuit connected in parallel to each of said plurality of diodes, and a conductive state or a non-conductive state of said by-pass circuit is controlled to change the number of said diodes connected to perform rectifying operations for changing a temperature-dependency of said cycle of said signal.

14. The timer circuit as claimed in claim 13, wherein said by-pass circuit comprises MOS transistors which are selectively made into conductive state to change the number of said diodes connected to perform rectifying operations.

15. The timer circuit as claimed in claim 13, wherein temperature characteristic varying circuit comprises:
a fuse circuit including resistance elements and fuses which are connected in series between a power supply and a ground; and
a gate circuit for receiving an input of a signal fetched from between said resistance element and said fuse and supplying an output to said by-pass circuit,
so that said fuses are selectively cut off to change the number of diodes connected to perform said rectifying operation.

16. A timer circuit generating a signal which defines a refresh cycle of memory cells dynamically storing data, wherein a cycle of said signal is controlled in accordance with a temperature-dependency of data holding time of said memory cells, wherein said timer circuit comprises a rectifying device with a temperature-dependent current characteristic, a power circuit for generating a power current in response to a current flowing through said rectifying device, and a clock generating circuit for receiving a supply of a power from said power circuit and generating a clock signal, and
wherein said rectifying device includes a by-pass circuit that comprises fuses which are selectively cut off to change a number of diodes connected to perform a rectifying operation for changing a temperature-dependency of said cycle of said signal.

17. A semiconductor memory device having:
memory cells dynamically storing data; and
a timer circuit generating a signal which defines a refresh cycle of said memory cells,
wherein a cycle of said signal is controlled in accordance with a temperature-dependency of data holding time of said memory cells, and wherein said timer circuit further includes a circuit that controls a variable temperature-dependency of said cycle of said signal using a rectifying device having at least one diode that is controlled to perform rectifying operations for changing said variable temperature dependency, a power circuit for generating a power current in response to a current flowing through said rectifying device, and a clock generating circuit for receiving a supply of a power from said power circuit and generating a clock signal.

18. The semiconductor memory device as claimed in claim 17, wherein said cycle of said signal is decreased upon temperature increase.

19. The semiconductor memory device as claimed in claim 17, wherein said timer circuit comprises a rectifying device with a temperature-dependent current characteristic, a power circuit for generating a power current in response to a current flowing through said rectifying device, and a clock generating circuit for receiving a supply of a power from said power circuit and generating a clock signal.

20. The semiconductor memory device as claimed in claim 19, wherein said rectifying device includes a diode connected in series to a power supply, a resistance connected in series between said diode and a ground, and a MOS transistor connected in parallel to said resistance, and a conductive state or a non-conductive state of said MOS transistor is controlled by a signal which switches the device between in a stand-by state and in an active state.

21. The semiconductor memory device as claimed in claim 19, wherein said semiconductor memory device comprises a rectifying device having a diode connected in series to an output of a constant voltage generating circuit and a level shifter for converting an amplitude of an output signal from said timer circuit into a MOS level.

22. The semiconductor memory device as claimed in claim 17, wherein said cycle of said signal in a stand-by state is longer than said cycle of said signal in an active state.

23. The semiconductor memory device as claimed in claim 17, further comprising a switch circuit which selects and outputs any of an output signal from said timer circuit and another output from a binary counter which divides a cycle of said output signal from said timer circuit in response to said state control signal.

24. A semiconductor memory device, comprising:
memory cells dynamically storing data; and
a timer circuit generating a signal which defines a refresh cycle of said memory cells.
wherein a cycle of said signal is controlled in accordance with a temperature-dependency of data holding time of said memory cells.

wherein said timer circuit comprises a rectifying device with a temperature-dependent current characteristic, a power circuit for generating a power current in response to a current flowing through said rectifying device, and a clock generating circuit for receiving a supply of a power from said power circuit and generating a clock signal, and wherein said rectifying device has a temperature characteristic varying circuit, and said temperature characteristic varying circuit includes a plurality of diodes connected in series and a by-pass circuit connected in parallel to each of said plurality of diodes, and a conductive state or a non-conductive state of said by-pass circuit is controlled to change the number of said diodes connected to perform rectifying operations for changing a temperature-dependency of said cycle of said signal.

25. A semiconductor memory device with a word pulse generating circuit which has:

a rectifying device with a variable temperature-dependent current characteristic;

a power circuit for generating a power current in response to a current flowing through said rectifying device; and a delay circuit receiving a power supply from said power circuit and delaying a trigger signal for a word pulse, wherein said rectifying device includes a diode connected in series to a power supply, a resistance connected in series between said diode and a ground, and a MOS transistor connected in parallel to said resistance, and a conductive state or a non-conductive state of said MOS transistor is controlled by a state control signal which switches the device between in a stand-by state and in an active state.

26. A timer circuit, comprising:

a first current mirror circuit connected between a power voltage and a grand voltage and a current path of a primary side of the current mirror circuit passes through said power voltage, a first conductivity-type MOS transistor; and another first conductivity-type MOS transistor and said grand voltage;

a temperature dependency providing circuit including a diode connected between the power voltage and the primary side of the first current mirror circuit and connected in series to a resistance to provide a function of a load at the primary side of the first current mirror circuit and a temperature independency and to supply to the first current mirror circuit through the first conductivity-type MOS transistor a primary side current flowing through the power voltage, the diode, the resistance and a second conductivity-type MOS transistor; and a clock generating circuit which is connected to a secondary side of the first current mirror circuit to generate a clock signal having a cycle depending upon temperature according to the secondary current flowing to the secondary side of the first current mirror circuit, wherein a current path flowing through the diode and the resistance of the temperature dependency providing circuit presents outside the primary side current path of the first current mirror circuit.

27. A timer circuit as claimed in claim 26, wherein each source of a first MOS transistor and a second MOB transistor of a conductivity-type MOS transistor is respectively connected to a power voltage, a gate and a drain of the first MOS transistor of the first conductivity-type translator and a gate of the second MOS translator of the first conductivity-type transistor are commonly connected to a drain of the first MOS transistor of the second conductivity-type transistor, a source of the first MOB transistor of the second conductivity-type transistor, a source of the second MOB transistor of the second conductivity-type transistor as well as a source of the third MOS transistor of the second conductivity-type transistor are connected to the ground, the gate of the first MOS transistor of the second conductivity-type transistor, the drain and the gate of the second MOS translator of the second conductivity-type transistor and the gate of the third MOS transistor of the second conductivity-type transistor are connected in common to provide a first common connection which is connected through a resistance clement to the first power voltage, the drain of the second MOS transistor of the first conductivity-type transistor forms a second power voltage while the drain of the third MOS transistor of the second conductivity-type transistor forms a third power voltage, at least more than one inverters are connected to the second power voltage and the third power voltage and then the inverters are connected in series, each capacitance is inserted between an inverter output and the ground and to one of the inverters are connected the first power voltage and a buffer connected to the ground to provide a timer output.

* * * * *